(12) United States Patent
AlQahtani et al.

(10) Patent No.: US 9,810,052 B2
(45) Date of Patent: Nov. 7, 2017

(54) MULTILATERAL WELLS PLACEMENT VIA TRANSSHIPMENT APPROACH

(71) Applicants: Saudi Arabian Oil Company, Dhahran (SA); Texas Tech University System, Lubbock, TX (US)

(72) Inventors: Ghazi D. AlQahtani, Lubbock, TX (US); Noah E. Berlow, Amarillo, TX (US); Mohamed Y. Soliman, Houston, TX (US)

(73) Assignees: Saudi Arabian Oil Company, Dhahran (SA); Texas Tech University System, Lubbock, TX (US)

( * ) Notice: Subject to any disclaimer, the term of this patent is extended or adjusted under 35 U.S.C. 154(b) by 743 days.

(21) Appl. No.: 14/330,510

(22) Filed: Jul. 14, 2014

(65) Prior Publication Data

US 2016/0011332 A1    Jan. 14, 2016

(51) Int. Cl.
| | |
|---|---|
| G06G 7/48 | (2006.01) |
| E21B 43/30 | (2006.01) |
| E21B 41/00 | (2006.01) |
| G01V 99/00 | (2009.01) |
| G06F 17/50 | (2006.01) |
| G06Q 10/04 | (2012.01) |

(52) U.S. Cl.
CPC .......... *E21B 43/30* (2013.01); *E21B 41/0092* (2013.01); *G01V 99/005* (2013.01); *G06F 17/5009* (2013.01); *G06Q 10/04* (2013.01)

(58) Field of Classification Search
None
See application file for complete search history.

(56) References Cited

PUBLICATIONS

Al-Qahtani, Khalid et al., "Integration and Coordination of Multirefinery Networks: A Robust Optimization Approach", May 26-28, 2008, Proceedings of the 9th IASTED International Conference Modeling and Simultation.*
Yeten, Burak et al., "Optimization of Nonconventional Well Type, Location, and Trajectory", 2003, SPE Annual Technical Conference and exhibition, Society of Petroleum Engineering.*
da Cruz, Paulo S. et al., "The Quality Map: A Tool for Reservoir Uncertainty Quantification and Decision Making", 2004, SPE Annual Technical Conference and Exhibition, Society of Petroleum Engineers.*
International Search Report and Written Opinion for related PCT application PCT/US2015/039732 dated Dec. 14, 2015.
Da Cruz, et al. "The Quality Map: A Tool for Reservoir Uncertainty Quantification and Decision Making", SPE Reservoir Evaluation & Engineering, 2004, pp. 6-14, Society of Petroleum Engineers.

(Continued)

*Primary Examiner* — Cedric D Johnson
(74) *Attorney, Agent, or Firm* — Bracewell LLP; Constance G. Rhebergen; Albert B. Kimball, Jr.

(57) ABSTRACT

A multilateral well placement methodology is provided for hydrocarbon reservoirs utilizing transshipment network optimization to best fit productivity conditions in the reservoir. Multilateral well trajectories are generated which ensure contact with hydrocarbon rich pockets in the reservoir. Different levels of branching for lateral wells are also permitted.

30 Claims, 23 Drawing Sheets

(56) References Cited

PUBLICATIONS

Sergio Da Cruz et al., "Reservoir Management Decision-Making in the Presence of Geological Uncertainty", www.ccgalberta.com/ccgresources/report02/2000-117-reservoir_modeling.pdf, 2000, pp. 1-26.

Taha, "Transportation Model and Its Variants", Operations Research: An Introduction, 2007, pp. 193-234, 8th Edition, Chapter 5, Pearson Education Inc.

Yeten et al., "Optimization of Nonconventional Well Type Location and Trajectory", Society of Petroleum Engineers 77565, 2002, pp. 1-14, Society of Petroleum Engineers Inc.

A. Y. Bukhamsin, M. M. Farshi, and K. Aziz, "Optimization of Multilateral Well Design and Location in a Real Field Using a Continuous Genetic Algorithm," SPE 136944 Annual Technical Conference and Exhibition, 2010.

C. L. Farmer, J. M. Fawkes, and N. I. M. Gould, "Optimal Multilateral Well Placement," Oxford University Mathematical Institute, No. 10, pp. 1-13, 2010.

J. E. Onwunalu and L. J. Durlofsky, "A New Well-Pattern-Optimization Procedure for Large-Scale Field Development," SPE Journal, No. Sep. 2011.

J. M. Harris, J. L. Hirst, and M. J. Mossinghoff, Combinatorics and Graph Theory, Second Edi. Springer, 2008, p. 34.

J. Onwunalu, "Optimization of Nonconventional Well Placement Using Genetic Algorithms and Statistical Proxy," 2006.

M. M. Saggaf, "A Vision for Future Upstream Technologies," SPE 109323 Journal of Petroleum Technology, Mar. 2008.

P. S. Cruz, R. N. Home, U. Stanford, C. V Deutsch, and U. Alberta, "The Quality Map: A Tool for Reservoir Uncertainty Quantification and Decision Making," SPE Annual Technical Conference and Exhibition, No. Dec. 2003, pp. 3-6.

R. K. Ahuja, T. L. Magnanti, and J. B. Orlin, Network Flows: Theory, Algorithms, and Applications. Prentice-Hall, Inc, 1993, p. 23-31.

S. Dasgupta, C. H. Papadimitriou, and U. V Vazirani, Algorithms. McGraw-Hill, 2006, p. 21.

V. Artus, L. J. Durlofsky, J. Onwunalu, and K. Aziz, "Optimization of Nonconventional Wells Under Uncertainty Using Statistical Proxies," Computational Geosciences, vol. 10, No. 4, pp. 389-404, 2006.

Y. Burak, L. Durlofsky, and A. Khalid, "Optimization of Nonconventional Well Type, Location and Trajectory," SPE 77565 Annual Technical Conference and Exhibition, Sep. 2002.

\* cited by examiner

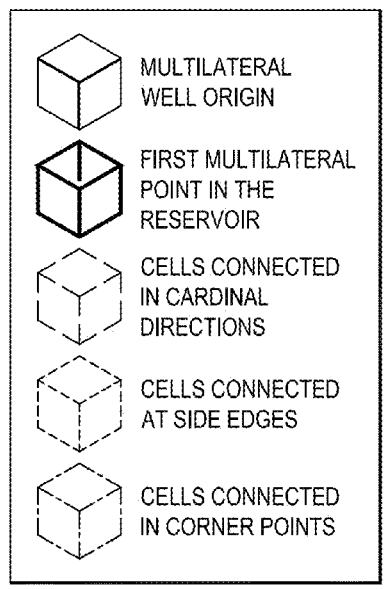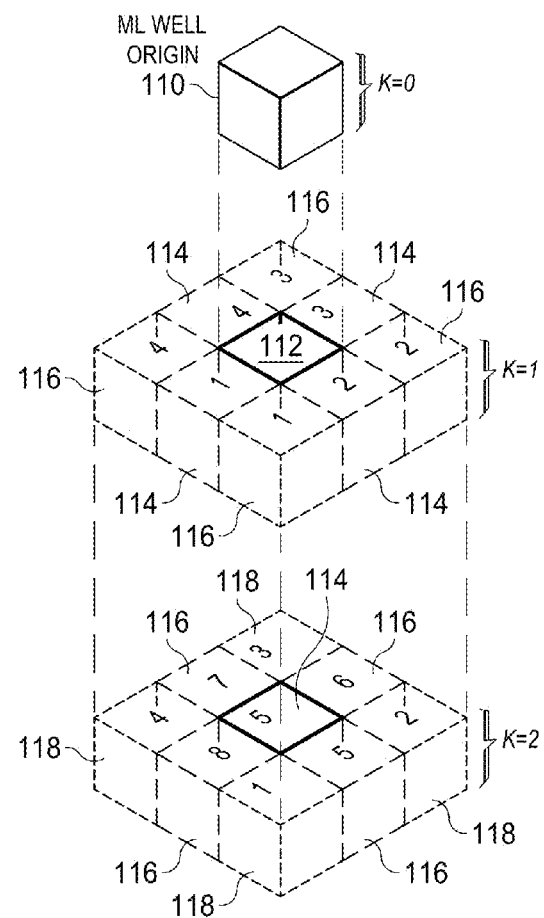
FIG. 13

MULTILATERAL WELLS PLACEMENT VIA TRANSSHIPMENT APPROACH

CROSS-REFERENCE TO RELATED APPLICATIONS

The present invention relates to optimizing the placement of wells in an oilfield, as does a commonly owned, co-pending U.S. Patent Application entitled "METHODS, SYSTEMS, AND COMPUTER MEDIUM HAVING COMPUTER PROGRAMS STORED THEREON TO OPTIMIZE RESERVOIR MANAGEMENT DECISIONS", Ser. No. 14/330,324, filed Jul. 14, 2014, and naming Applicants AlQahtani, Soliman, and de Farias, Jr. as Inventors.

BACKGROUND OF THE INVENTION

1. Field of the Invention

The present invention relates to optimizing the placement of wells in an oilfield. More specifically, the present invention relates to well placement optimization and to location and placement of multilateral wells in producing hydrocarbon reservoirs.

2. Description of the Related Art

Nonconventional or multilateral wells (hereinafter called "multilateral") have become more utilized in the last two decades in producing hydrocarbon reservoirs. The main advantage of using such wells against conventional and single bore wells comes from the additional access to reservoir rock by maximizing the reservoir contact. Multilateral wells have evolved in the petroleum industry with more complex designs and architecture, (such as what are known as Extended Reach wells, Maximum Reservoir Contact wells, and Extreme Reservoir Contact wells). The challenge associated with deploying multilateral wells has been whether the trajectories for the main bore, laterals, and sublaterals are being placed in the best spots in the reservoir. In other words, the design for placement of multilateral wells should be optimum to efficiently drain hydrocarbon reservoirs.

Finding the best multilateral well design and location has been the topic of several studies. Some of the approaches have been used were Genetic Algorithms (GA) and Particle Swarm Optimization (PSO). For example, as described in "Optimization of Nonconventional Well Type, Location and Trajectory", SPE 77865, September 2002, a GA approach was used as the main optimization engine to find the optimum multilateral location and design. To deal with the situation of long and large number of runs, helper algorithms were used to accelerate the optimization procedure. On a well level scale, the parameters to optimize were the coordinates that define the heel and the toe of the laterals in a complex well, the length of the lateral in horizontal plane, the angle between the lateral and the x-axis, the number of junctions the mother bore may have, and the number of laterals that may originate from any junction. The objective function was cumulative oil or Net Present Value (NPV) and the resultant types of multilateral well depend mainly on type of the reservoir and degree of uncertainty.

As described in "Optimization of Nonconventional Wells Under Uncertainty Using Statistical Proxies," Computational Geosciences, Vol. 10, No. 4, pp. 389-404, 2006, V. Artus, L. J. Durlofsky, J. Onwunalu, and K. Aziz and in "Optimization of Nonconventional Well Placement Using Genetic Algorithms and Statistical Proxy," J. Onwunalu, 2006, the GA approach was combined with a statistical proxy that was described as a clustering based technique. This technique was used to establish relationships between the variables and the objective function (i.e. NPV) using unsupervised learning methods.

The combined approach was applied to find optimum location of a dual lateral well using the same parameterization described in "Optimization of Nonconventional Well Type, Location and Trajectory, SPE 77565, Annual Technical Conference and Exhibition, September 2002, Y. Burak, L. Durlofsky, and A. Khalid, which was also used in "Optimization of Multilateral Well Design and Location in a Real Field Using a Continuous Genetic Algorithm" SPE 136944, Annual Technical Conference and Exhibition, 2010, with continuous GA instead of binary GA.

"A New Well-Pattern-Optimization Procedure for Large-Scale Field Development," SPE 124364, September, 2011, J. E. Onwunalu and L. J. Durlofsky, described well pattern optimization that included a well pattern description, followed by well perturbation, that are incorporated into particle swarm organization or PSO as the core optimizer. Two dual laterals location optimization were investigated. Due to the large number of variables that were needed to be parameterized for each well, the computational expense was high, which resulted in wells with single mother bores.

"Optimal Multilateral Well Placement," Oxford University Mathematical Institute, No. 10, pp. 1-13, 2010, C. L. Farmer, J. M. Fowkes, and N. I. M. Gould described a proxy from reservoir simulator output by using a radial basis function model, coupled with a Branch and Bound (B&B) global optimizer to find optimum location and trajectory for single multilateral well. The determined resultant location was compared with GA results and showed advantage in using B&B by achieving higher objective function values. The parameterization of the multilateral well was the same described in SPE 77565.

The methods discussed above were able to find trajectories and locations for small number of laterals and limited number of multilateral wells. However, the laterals formed were built as straight lines which might not reflect a practical well associated with actual reservoir complexity. So far as is known, none of the foregoing work dealt successfully with locating the best hydrocarbon rich areas and the optimum trajectories for large groups of multilateral wells.

Other methods of well placement have also been disclosed. For example, U.S. Published Patent Application No. 2011/0015909 was concerned with modeling subterranean reservoir models with many underground details obtained from processing geological and geophysical data. Reservoir details were assigned as needed, such as heterogeneity data, natural fractures, faults, tight reservoir streaks, vugs, shale bodies, discontinuous shale bodies and boundary conditions. Wellbore trajectories which were predetermined from well drilling reports were also integrated in the model.

U.S. Published Patent Application No. 2013/0024174 described a procedure to rank selected range criteria, such as be bounds on oil or gas volume, permeability, saturation, relative permeability, minimum oil saturation, maximum gas oil ratio or maximum water cut and the like. Based on the selected criteria, a certain number of cells were highlighted. From the highlighted cells, connected ones were reported. Drainage volume was found for the groups of connected cells, and a property cut-off was applied to eliminate cells with very low permeability values. Oil or gas in place was calculated for every group of connected cells which can be sorted afterwards from high to low oil or gas in place values. After multiple adjustments to drainable volumes cells (i.e. distance from a boundary and tortuosity of a connected volume) and sorting, the final completion intervals were revealed which were the candidate targets to be penetrated by wells.

Wells were generated for the candidate targets with a mathematical formulation, with the constraints used being selected from well characterization criteria from wells in place. Optimum wells found by the formulation were validated with streamline simulation and the output values were used as new set of constraints for the next new wells.

SUMMARY OF THE INVENTION

Briefly, the present invention provides a new and improved computer implemented method of formulating well completions of at least one multilateral well in a subsurface reservoir producing hydrocarbon fluids, the reservoir being organized as a reservoir model partitioned into a number of cells. With the computer implemented method, a reservoir simulation is performed to determine hydrocarbon fluid content of the cells in the reservoir model. A measure of profit for the cells is formed based on productivity of the determined hydrocarbon fluid content of the cells. A model for the at least one multilateral well is generated by transshipment network analysis of the measures of profit for the cells. Placement of the generated model of the at least one multilateral well in the reservoir model is then optimized, and an output display formed of the at least one multilateral well at a location in the reservoir model according to the step of optimizing placement.

The present invention also provides a new and improved data processing system for formulating well completions of at least one multilateral well in a subsurface reservoir producing hydrocarbon fluids, the reservoir being organized as a reservoir model partitioned into a number of cells. The data processing system includes a processor which performs a reservoir simulation to determine hydrocarbon fluid content of the cells in the reservoir model, and then forms a measure of profit for the cells based on productivity of the determined hydrocarbon fluid content of the cells. The processor also generates a model for the at least one multilateral well by transshipment network analysis of the measures of profit for the cells, and optimizes placement of the generated model of the at least one multilateral well in the reservoir model. The data processing system also includes a user interface which forms an output display of the at least one multilateral well at a location in the reservoir model according to the optimized placement.

The present invention also provides a new and improved A data storage device having stored in a non-transitory computer readable medium computer operable instructions for causing a data processing system to formulate well completions of at least one multilateral well in a subsurface reservoir producing hydrocarbon fluids, the reservoir being organized as a reservoir model partitioned into a number of cells. The instructions stored in the data storage device cause at least one processor in the data processing system to perform a reservoir simulation to determine hydrocarbon fluid content of the cells in the reservoir model, and form a measure of profit for the cells based on productivity of the determined hydrocarbon fluid content of the cells. The stored instructions also cause generation of a model for the at least one multilateral well by transshipment network analysis of the measures of profit for the cells, and optimization of placement of the generated model of the at least one multilateral well in the reservoir model. The stored instructions also cause formation of an output display of the at least one multilateral well at a location in the reservoir model according to the optimized placement.

BRIEF DESCRIPTION OF THE DRAWINGS

FIG. 13 is a schematic diagram of multilateral well path movement in an optimization model for multilateral well placement according to the present invention.

DETAILED DESCRIPTION OF THE PREFERRED EMBODIMENTS

Figure 1:
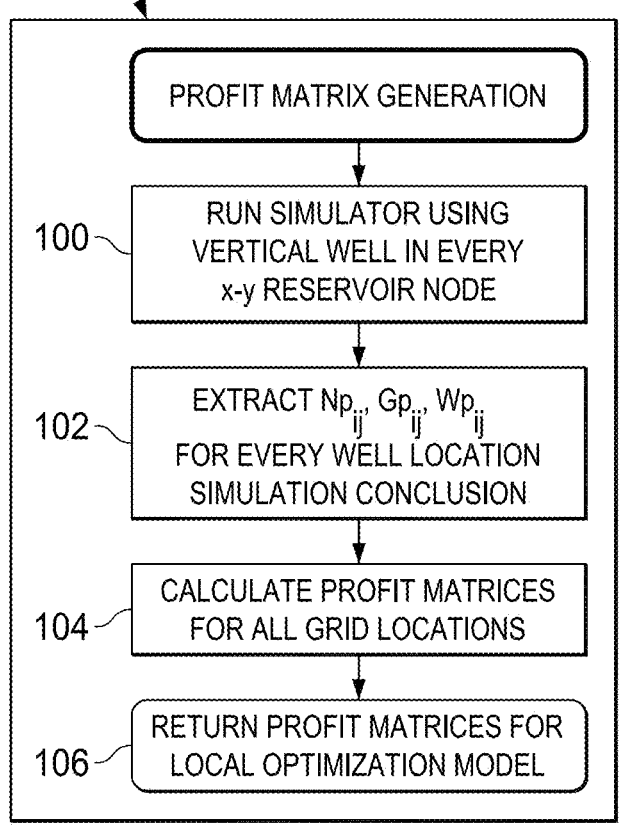
FIG. 1 is a functional block diagram of a flow chart of data processing steps for generating a profit matrix used in an optimization model for multilateral well placement according to the present invention.

According to the present invention, expected profit measures are obtained for cells of a reservoir organized into a grid of multiple cells. The reservoir can be a small one, or a large scale reservoir. U.S. Pat. Nos. 7,596,480 and 8,437,999 are examples of reservoirs organized into a grid of cells. The profit measures are formed as a profit matrix based on expected cumulative oil production and cumulative gas production for the individual cells of the reservoir grid. The profit measures are formed as a matrix based on expected cumulative oil production and cumulative gas production for the individual cells of the reservoir grid. The profit measures in the profit matrix are a basis for well placement of the multilateral wells. Optimum locations and trajectories are developed for the multilateral wells in local and global terms. A partitioning methodology is implemented for the processing to reduce the computational cost of the optimization process.

Generating Profit Measures

With the present invention, a plurality of multilateral wells is located by well placement methodology in a large scale reservoir so that a profit measure is maximized over selected chronicle life of a specific field. The present invention uses Mixed Integer Programming (MIP) as the engine for wells placement optimization.

A profit measure ($P_c$) is used and is calculated for every grid cell in the reservoir model using the following form:

$$(P_o Np_{ij} + P_g Gp_{ij} - C_{wh} Wp_{ij}) - \text{Capex}$$

Where:
Total Revenue=$P_o \times Np_{ij} + P_g \times Gp_{ij}$
Total Cost=Capex+Cwh×Wpij
Np=Cumulative Oil Production
Op=Cumulative Gas Production
Wp=Cumulative Water Production
Po=Oil Price per unit volume
Pg=Gas Price per unit volume
Cwh=Water handling cost per unit volume
i=The x☐coordinate of the selected cell
j=The y☐coordinate of the selected cell
Capex=Initial Capital expenditure The revenue from producing hydrocarbon fluids (oil and gas) and the cost associated with handling undesirable produced fluids (water) are determined in the profit matrix, which is then used for further processing. The profit matrix is calculated after utilizing a conventional reservoir simulator to generate quality cumulative oil, gas and water maps. The maps so generated can be used as an indicator of a region's likelihood for high potential productivity. An example of such map generation is described in: "The Quality Map: A Tool for Reservoir Uncertainty Quantification and Decision Making," SPE Annual Technical Conference and Exhibition, SPE 97642, December 2003, pp. 3-6, 2004", P. S. Cruz, R. N. Home, U. Stanford, C. V. Deutsch, and U. Alberta.

The model should preferably run for the reservoir simulator at every grid location for a long enough time to apprehend assorted trends in collective hydrocarbon volumes produced if only one producer is permitted. Therefore, three cumulative oil, gas and water maps are generated from a number of layers in the model used. Then, a profit matrix is calculated using values economic parameters in Table 1 for each grid site.

TABLE 1

| Economic Input Parameter | Value |
|---|---|
| Oil Price $/STB | 65 |
| Gas Price $/MSCF | 4.2 |

TABLE 1-continued

| Economic Input Parameter | Value |
|---|---|
| Water Handling Cost $/STB | 3.2 |
| CAPEX $/well | $2.30 \times 10^6$ |

FIG. 1 illustrates schematically in a flow chart C, the data processing steps performed in a data processing system D (FIG. 13) for generating a project matrix in an optimization model according to the present invention. As indicated in step 100, a conventional reservoir simulator generates quality oil, gas and water maps for a selected reservoir in which multilateral wells are to be subject of well placement. A number of available simulators are available for this purpose such as the POWERS simulator from Saudi Aramco and the Eclipse simulator from Schlumberger. It should be understood that others may also be used if desired.

During step 102, the cumulative oil production values $Np_{ij}$, cumulative gas production values $Gp_{ij}$, and cumulative water production values $Wp_{ij}$, determined for each the reservoir grid location cells i, j by the simulator during step 100 are then extracted.

During step 104, the data processing system determines profit matrices for the reservoir grid locations i, j according to Equation (1) above. During step 106, the determined profit matrices from step 104 are referred to data storage in the data processing system D for local optimization modeling, as will be described.

The method described above was applied on a heterogeneous reservoir model to encompass possible challenges associated with problem computations. Table 2 below summarizes the properties for the reservoir model used to illustrate the methodology.

TABLE 2

| Reservoir Properties | Layer A | Layer B | Layer C | Layer D | Layer E |
|---|---|---|---|---|---|
| Initial Reservoir Pressure (psi) | 4000 | 4000 | 4000 | 4000 | 4000 |
| Model Dimensions (ft × ft × tf) | 300 × 300 × 35 | 300 × 300 × 75 | 300 × 300 × 86 | 300 × 300 × 55 | 300 × 300 × 65 |
| Porosity Avg (%) | 22.0 | 22.0 | 22.0 | 22.0 | 22.0 |
| Horizontal Permeability (md) | Avg: 175 Std. Dev: 91.1 | Avg: 175 Std. Dev: 91.1 | Avg: 175 Std. Dev: 91.1 | Avg: 175 Std. Dev: 91.1 | Avg: 175 Std. Dev: 91.1 |

Figure 2:
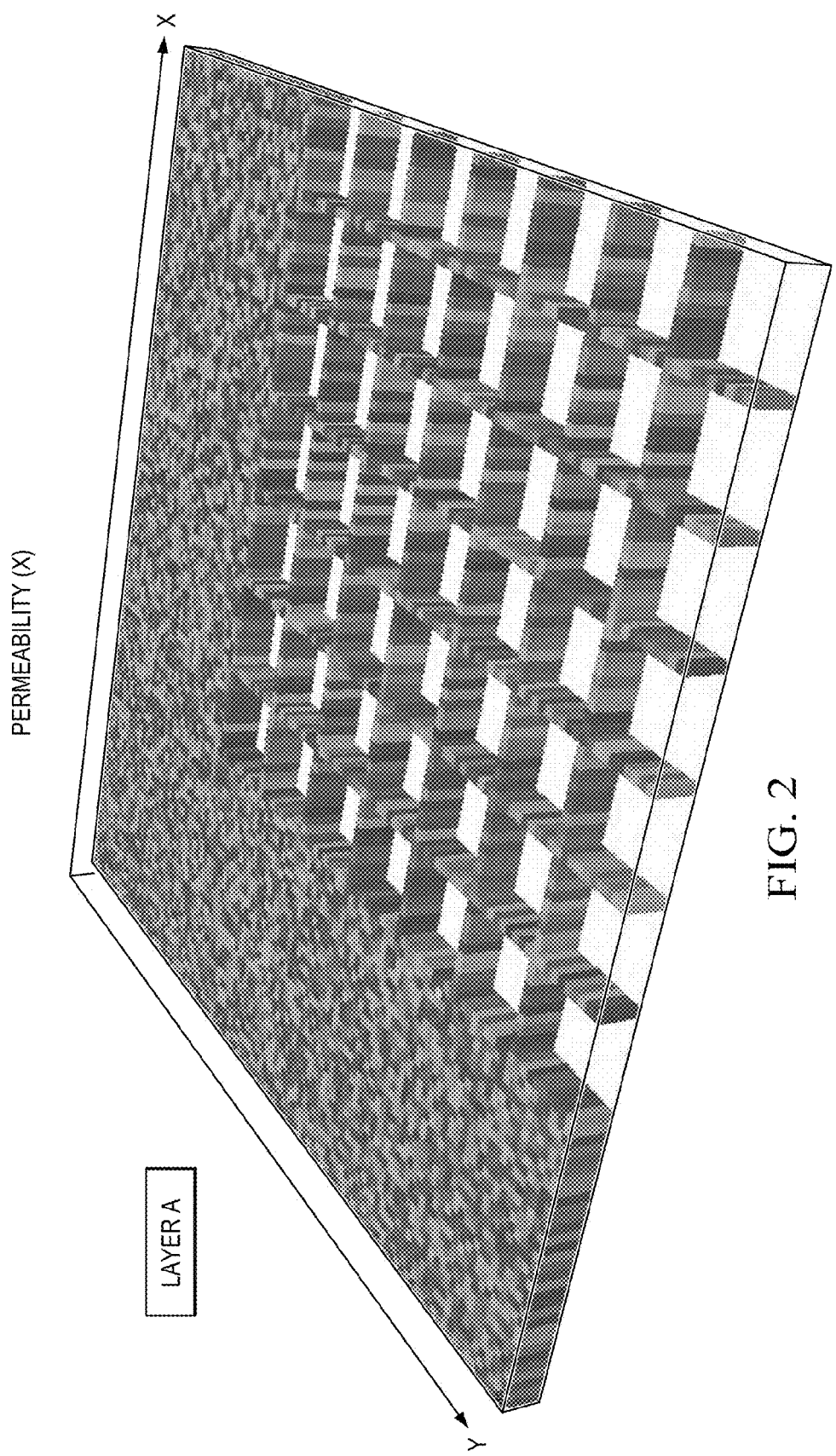
FIGS. 2, 3, 4, 5, 6, 7, 8, 9, 10, and 11 are displays of three dimensional permeability distribution in both x and y dimensions for five layers in a reservoir model for multilateral well placement according to the present invention.
Figure 3:
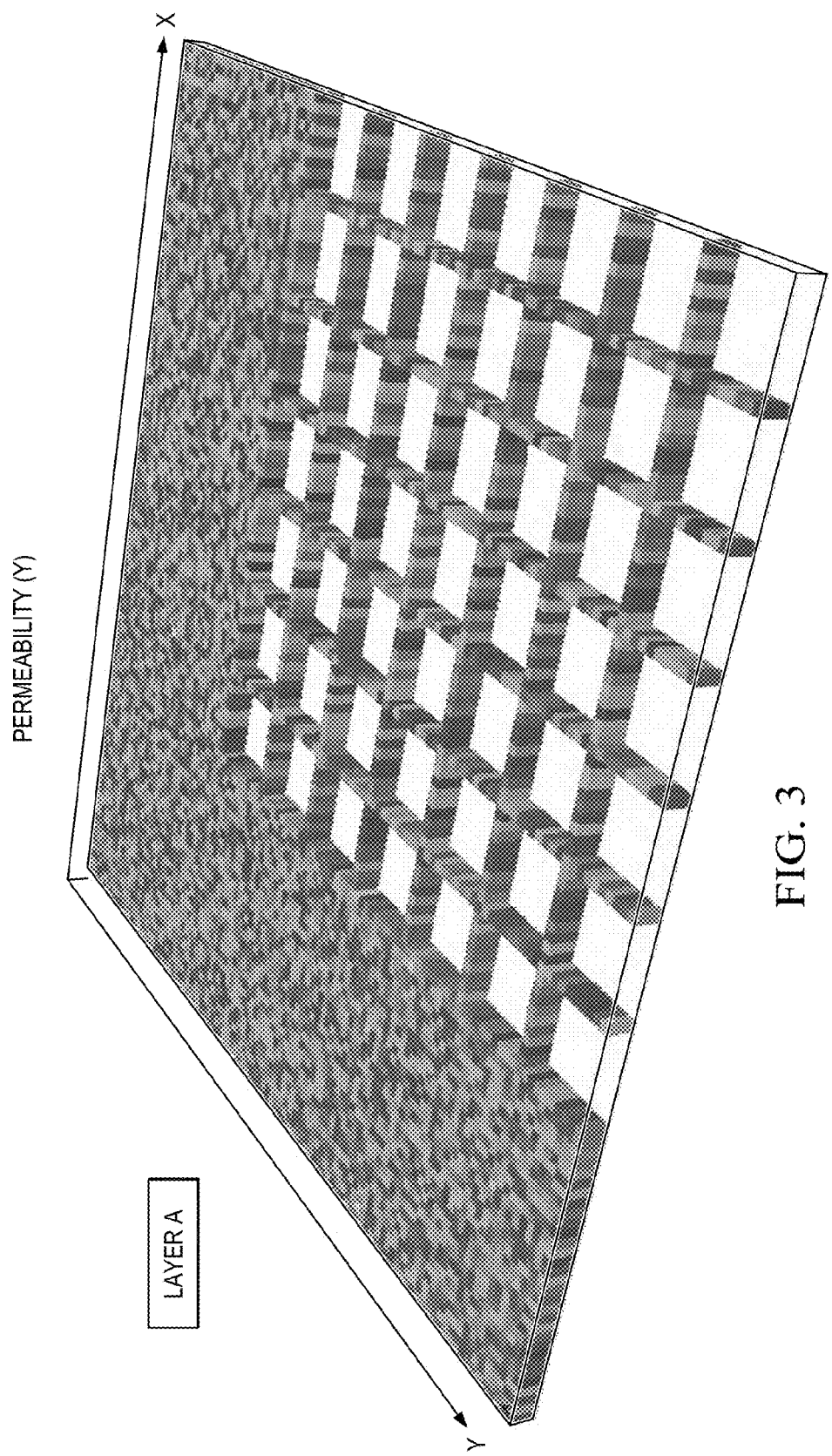
Figure 4:
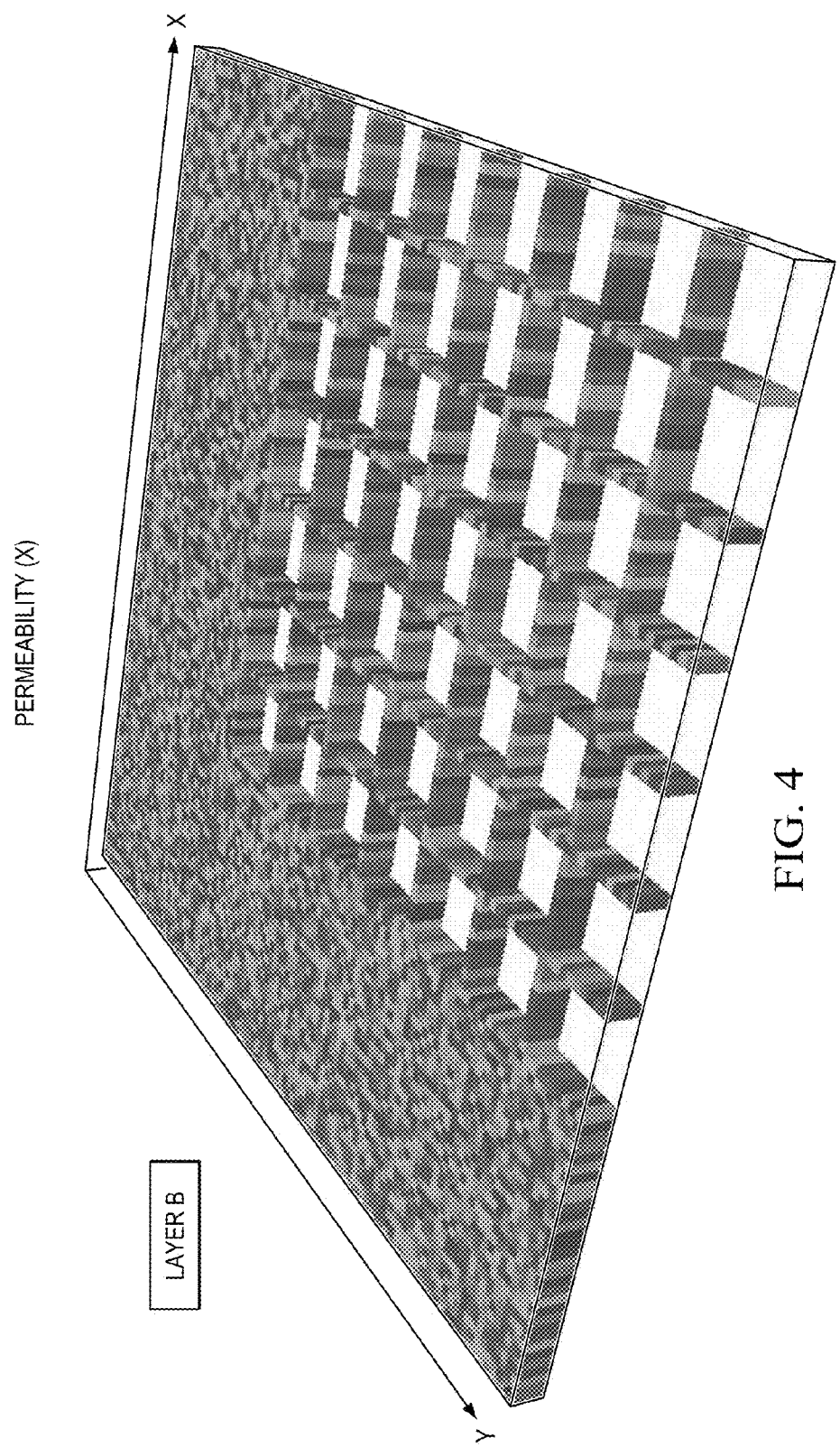
Figure 5:
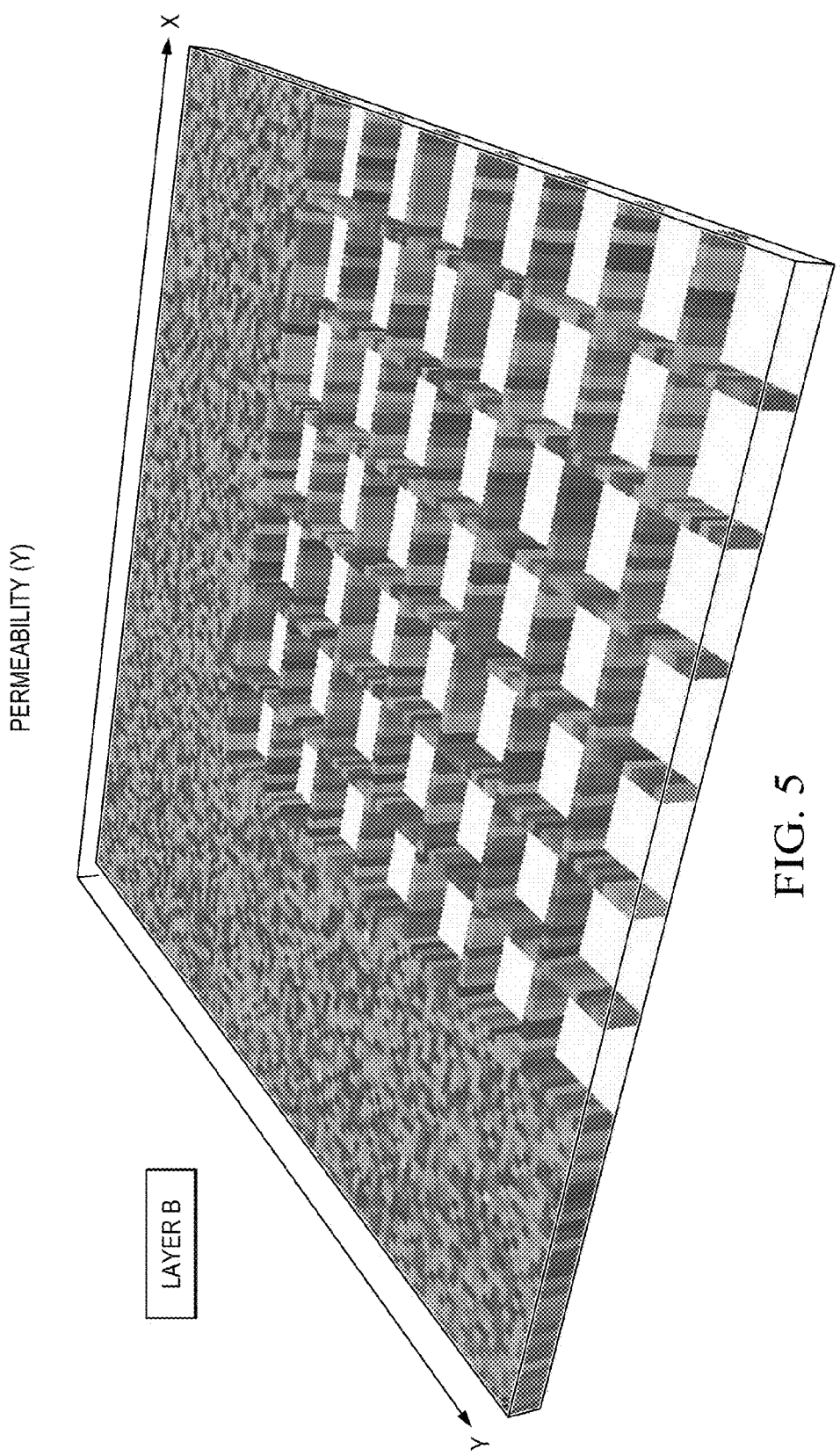
Figure 6:
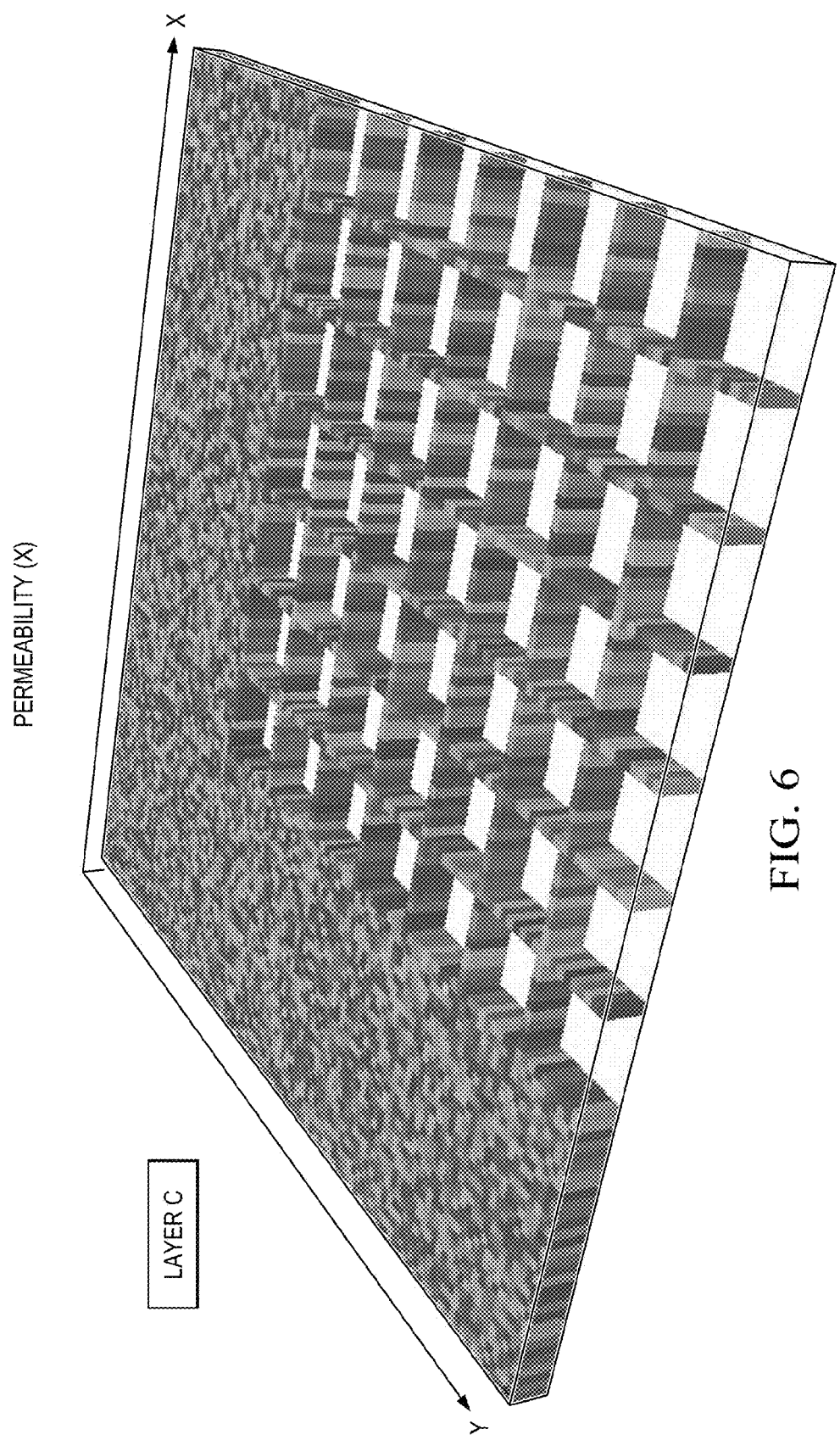
Figure 7:
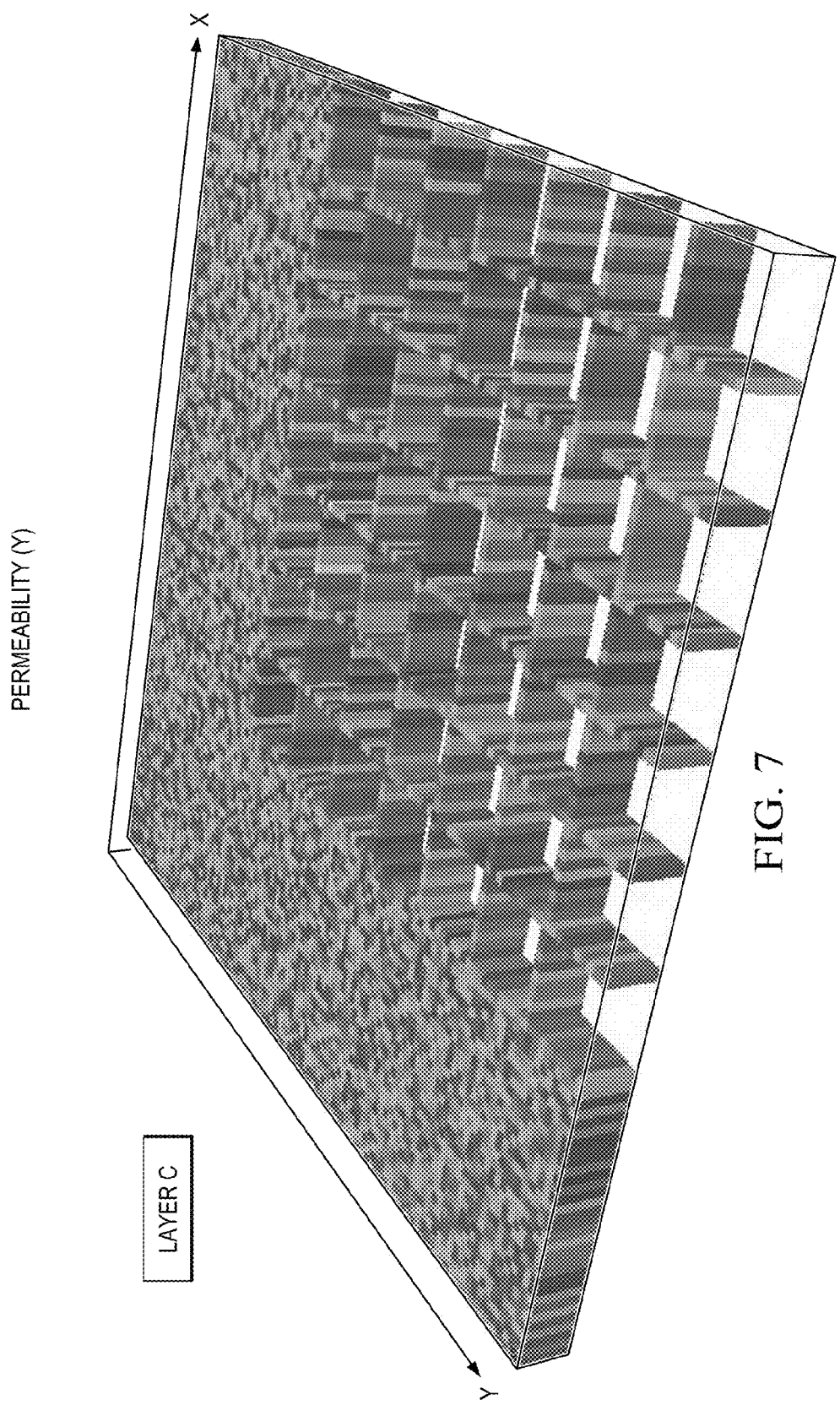
Figure 8:
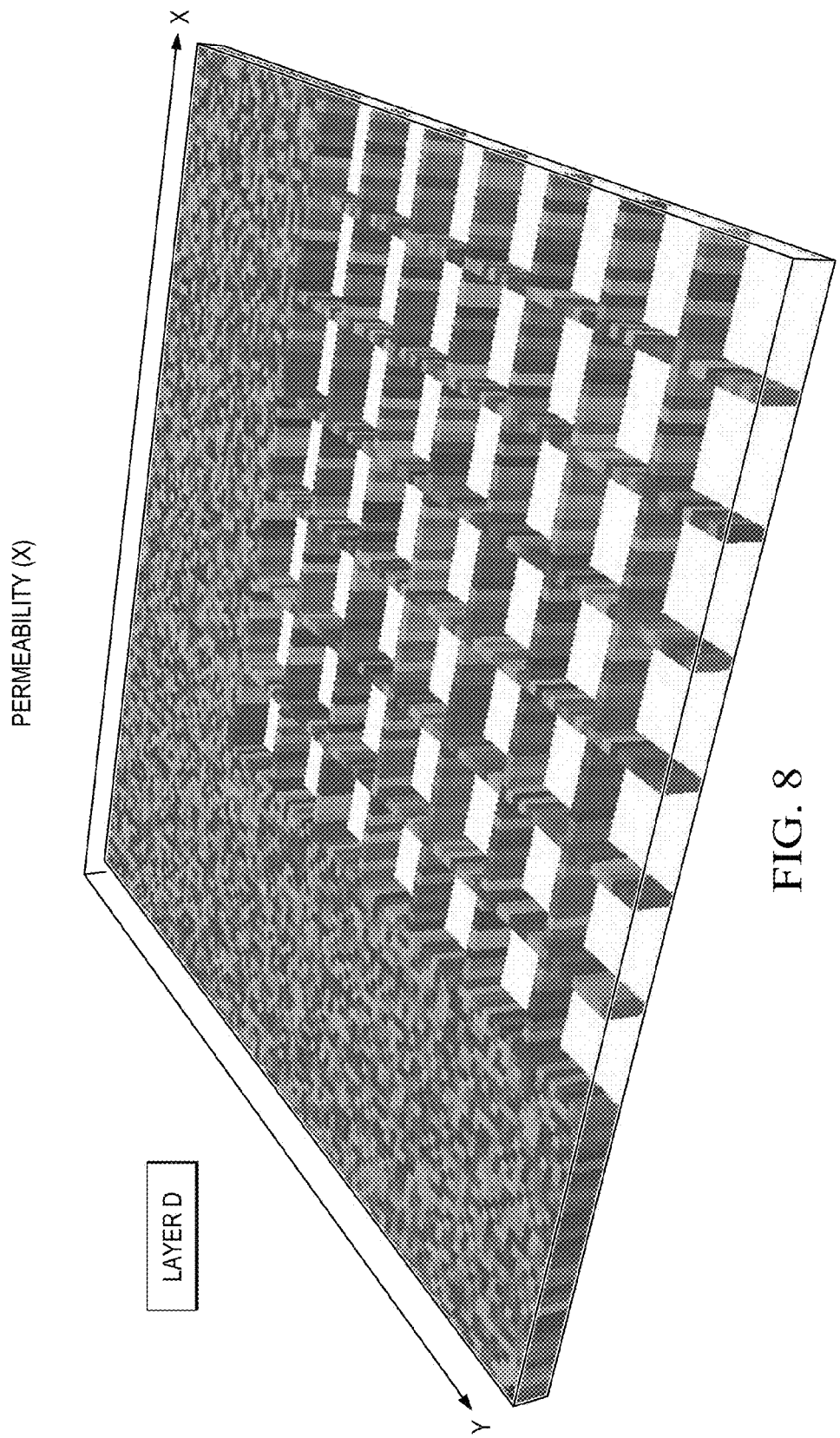
Figure 9:
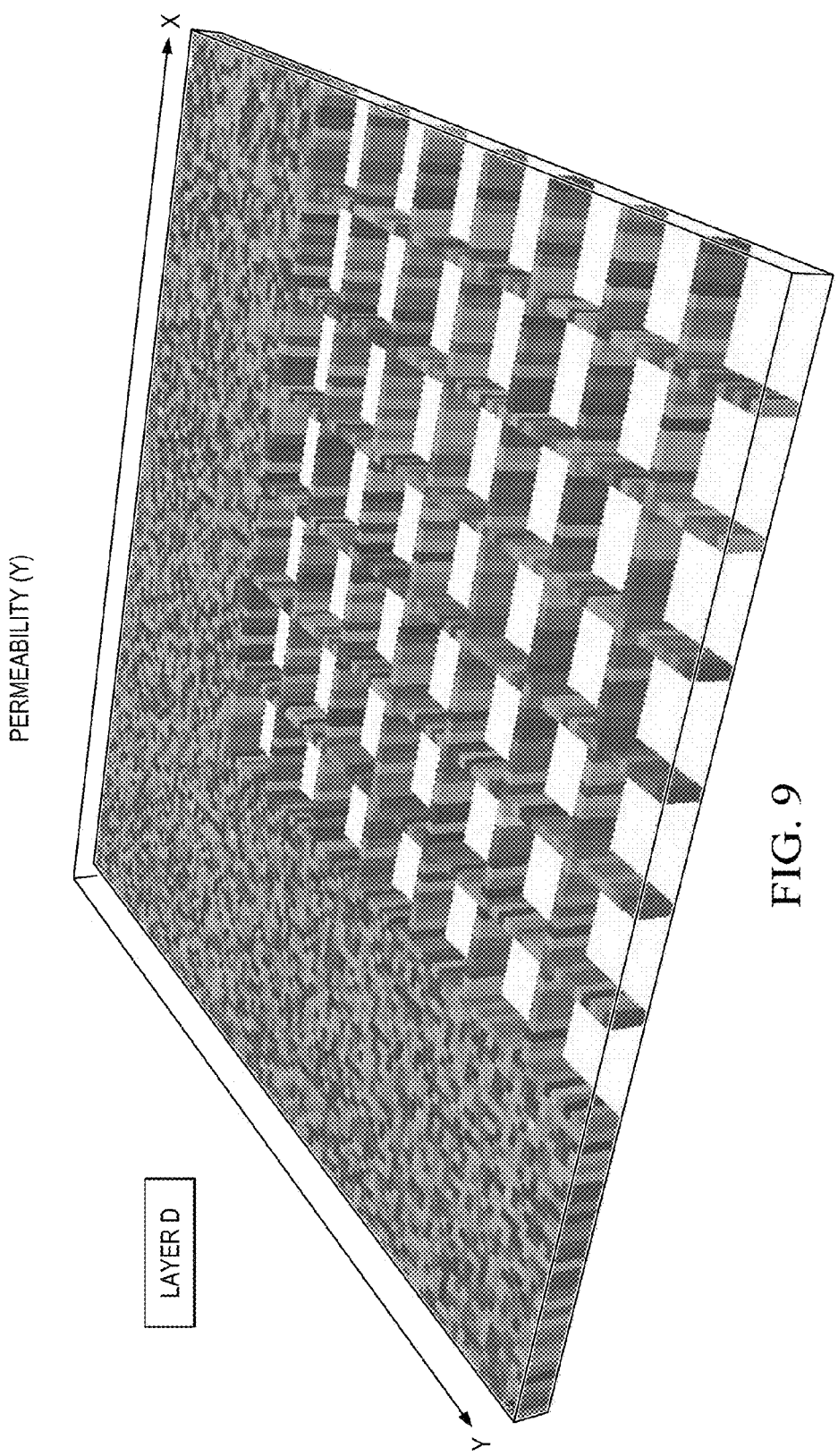
Figure 10:
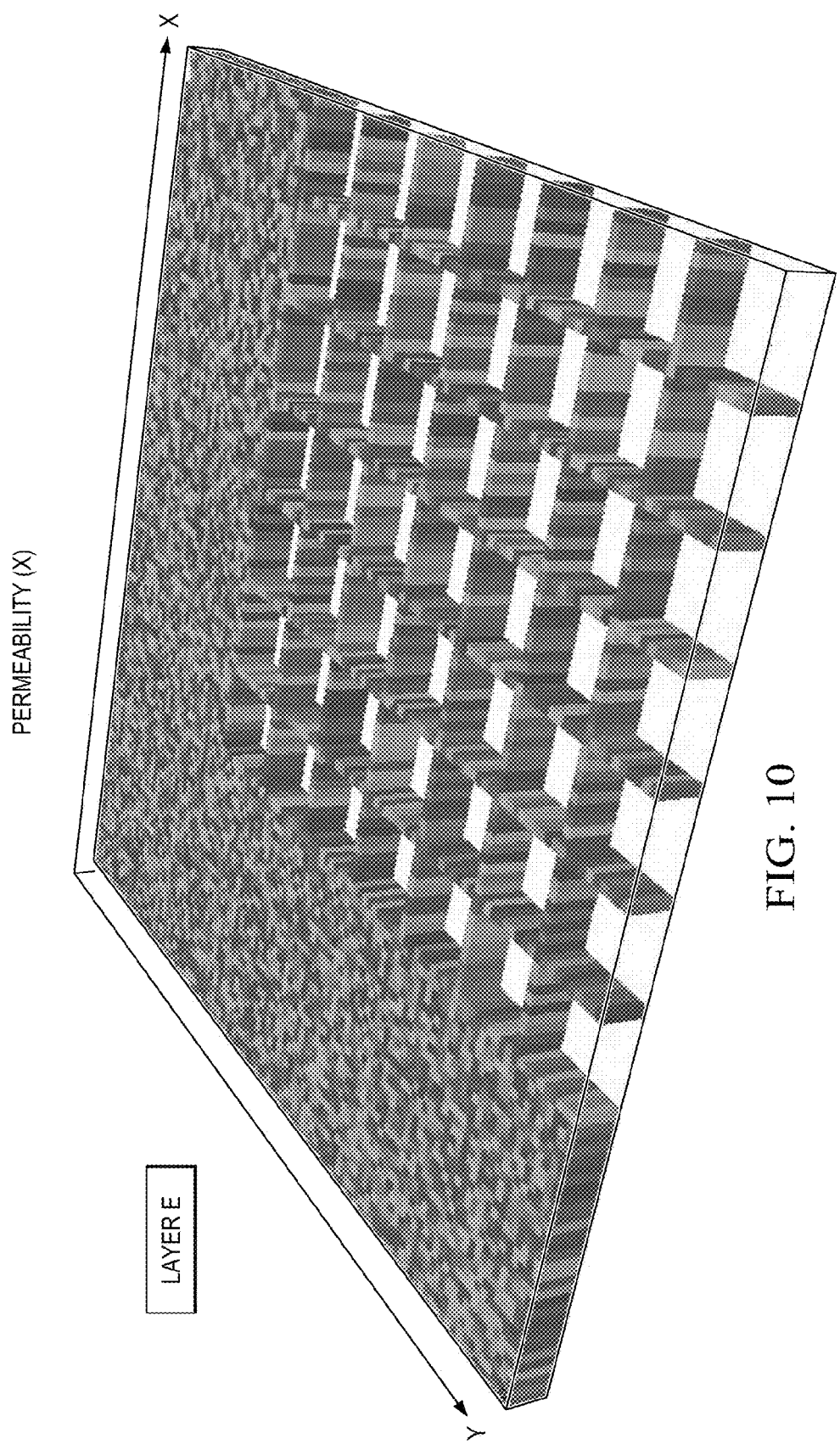
Figure 11:
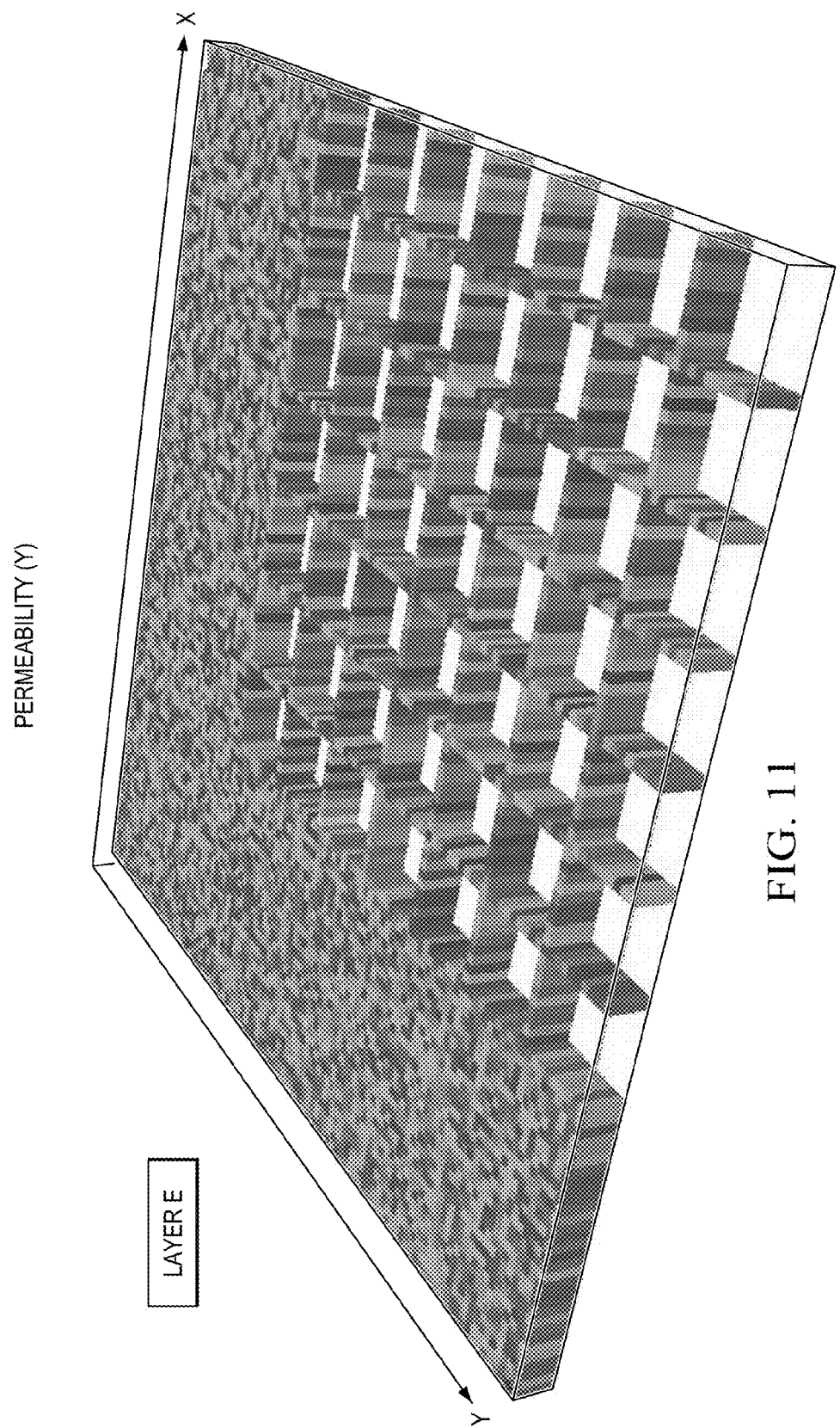

The reservoir model used included heterogeneous and anisotropic properties. FIGS. 2, 3, 4, 5, 6, 7, 8, 9, 10 and 11 shows three dimensional permeability layouts in the x and y directions for the layers in the 100×100×5 model. FIGS. 2 and 3 show permeability in the X and Y directions for Layer A of Table 2. FIGS. 4 and 5 show permeability in the X and Y directions for Layer 3. Correspondingly, permeability in the X and Y direction for Layers C, D and E are shown in FIGS. 6-7; 8-9; and 10-11, respectively.

Figure 12:
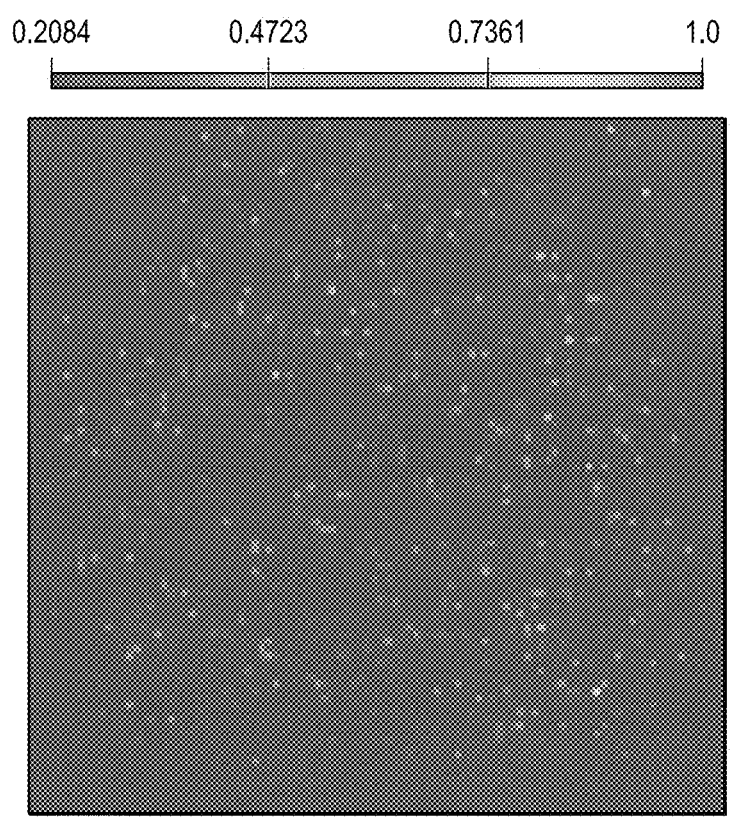
FIG. 12 is a plot of an average profit matrix for profit matrices obtained for the layers of FIGS. 2 through 11 according to the present invention.

With the present invention, the obtained matrices of profits per layer are used in the optimization process as a utility $P_c$ that influence the selection of completion points for a multilateral oil well. An average of the profit matrices is shown in FIG. 12. The data displayed in FIG. 12 provides insights about the profitable spots in the reservoir which are values of $P_c$ as a function of subsurface positions in the reservoir model. In general, the higher the profit indicator $P_c$, the better the spot to be included in a multilateral well.

Transshipment Optimization for Multilateral Wells

Local Multilateral Well Optimization

In the present invention processing, it has been found that a transshipment optimization methodology can be used to formulate, or construct, multilateral well designs in the reservoir of interest. The well designs formulated are associated with certain objective functions and constraints during the transshipment optimization.

The present invention provides a local optimization model to design a single multilateral well and its representation as a transshipment network. With the present invention, transshipment inspired model has been found advantageous for multilateral well placement for several reasons. First, the visual/graphical component of a transshipment model can be readily associated to the physical layout of a multilateral well. Second, the underlying graph theoretical nature of a transshipment model, as well as the guarantee of its resulting optimum solution taking the form of a tree, lend the transshipment model well to generating layouts of multilateral wells, or indeed connections between objects in 3D space. The construction of a transshipment model from an equation perspective also lends itself nicely to numerous extensions as well as quick solutions. Additionally, a transshipment model is an LP or linear program (MILP) and as such provides a degree of optimality which is not guaranteed through other methods such as GA, SA, particle swarm (or other stochastic optimization algorithms).

Reservoir Analysis Assumptions

An oil reservoir being considered is x×y×z 3–Dimensional reservoir. For analysis of this reservoir, the following assumptions are made. The dimensions of the reservoir x×y×z are for reasons of computer processing time, in a reasonably sized matrix, i.e. x×y×z≤100,000. This value x×y×z is the number of nodes in the reservoir model. Denote this set of nodes as G.

The set of all nodes G can be partitioned into two sets: N, a set of nodes which are not oil rich and C a set of oil rich nodes, also called completions. Creating this partition can be approached many ways. The top T points in each layer can simply be taken, where T=20% (x×y). Setting a value of T too high would significantly increase the time cost of the optimization, which should be considered depending on the computational resources which are available.

A drillable oil well can only be placed in a site above the top layer of the reservoir, which can be signified as layer k=0. In this formulation, it is assumed that the initial drill point for a network associated with an oil well will be a node directly beneath the oil well, in layer k=1. An illustration for the allowed movements that generates the multilateral well is depicted in FIG. 13.

Multilateral well path movement is the optimization model is schematically diagrammed in FIG. 13. As indicated in FIG. 13, a multilateral or ML well origin node 110 at layer k=0 is placed above the top layer of the reservoir. At (k=0) there is only one movement downward from ML well origin node 110 to the first point in the reservoir. The initial drill point for the network to be associated with the multilateral well is a node or cell 112 in layer k=1 directly beneath well origin node 110. At node 112, the first point of the ML well in layer k=1, there are seventeen allowed movements to find completion points in a specified radius range for construction of the ML well.

Cells 114 (five in number) are connected to node 112, four in cardinal directions in layer k=1, and one in layer k=2 directly beneath node 112. Cells 116 (eight in number) in layers k=1 and k=2 are connected at side edges to origin node 112. Cells 118 (four in number) in layer k=2 are connected at corner points to node 112.

An oil well is thus associated with a subterranean network that penetrates nodes or cells in the reservoir. This network can be built through all depths, starting at 1 and ending at k. Additionally, this network can only be built in a fixed $L_1$ distance r around the initial drill point for every well, see FIG. 14 for illustration. These constraints lead to a network which can be built in a 45° rotated square prism around the vertical nodes directly below the oil well.

The network associated with an oil well is limited by a maximum length of drilled sections and a maximum cost of used drilled sections. It is noted that the cost can include the cost of the initial capital expenditure for developing the field.

The network associated with an oil well is limited by a maximum length of drilled sections and a maximum cost of used drilled sections. Note that the cost can include the cost of the initial capital expenditure for developing the field.

Figure 14:
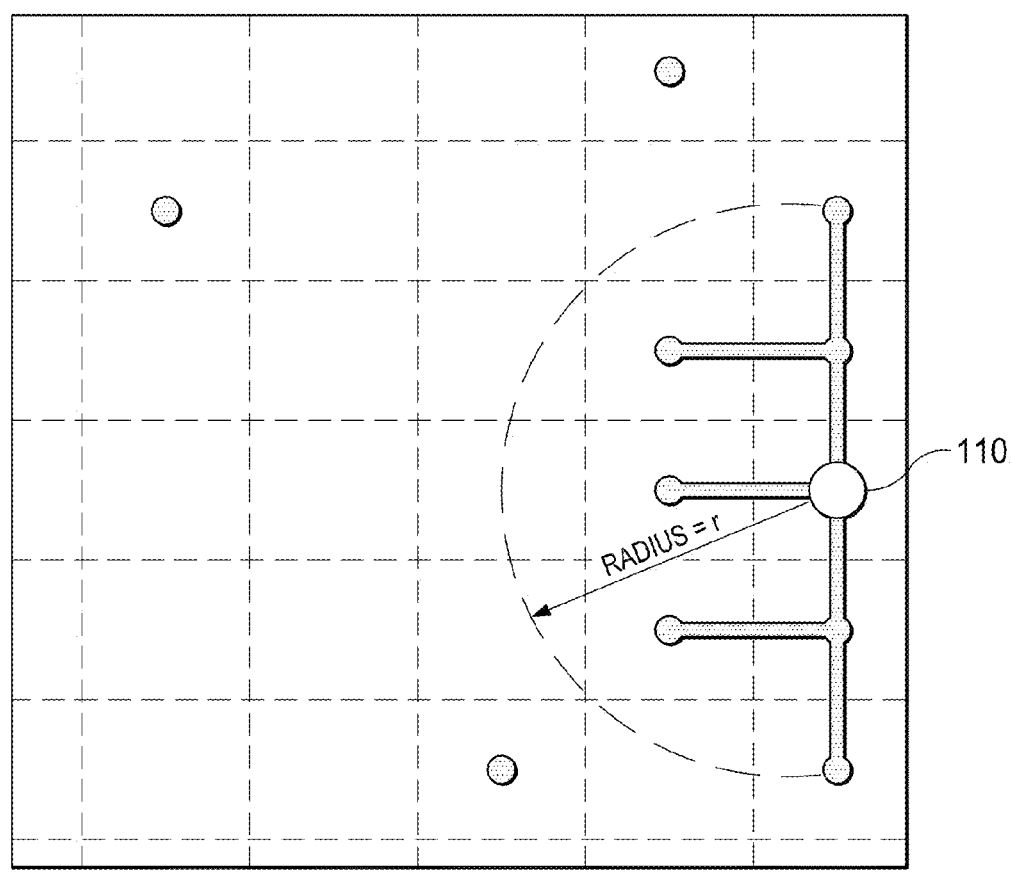
FIG. 14 is a top view illustration of construction of a well within a specified radius constraint around an initial drill point.

The area in which a network can be constructed is, as suggested previously noted, limited to a $L_1$ distance 45° rotated rectangular prism oriented around the oil well's origin. This means the oil well network can extend r units in any direction at every level of the reservoir. This is a practical limitation; physical constraints coupled with the high cost of horizontal drilling limit the ability of a network to spread far beyond the well's origin. This practical constraint leads to a $L_1$ distance constraint, which allows the networks to be of a tractable size as illustrated in FIG. 14.

Multilateral Well Design

Under these requirements a multilateral well is designed which maximizes profit. The present invention, in designing multilateral wells for a reservoir, partitions the reservoir into nodes. The nodes in the reservoir can be considered as vertices in a graph, and the potential drilled sections connecting nodes as edges of the graph. The relationships so established corresponding concepts in graph theory.

The oil rig drilling on layer k=0 as shown in FIG. 13 acts as a root of the multilateral well graph. The vertex directly below the platform, on layer k=1, is the only vertex that can connect directly to the root. As the oil rig indicates the origin of the multilateral well, the edge between layers k=0 and k=1 is directed from k=0 to k=1.

The necessary physical connections between drilled sections imply the resulting multilateral well can be represented with a strongly connected digraph, as all vertices in the network connect to the root. No assumption is made about directionality between any other vertices in the graph at this point. Directionality is discussed further below. For now, it is sufficient to say the edges in the graph between vertices on the same level are considered undirected and vertical movement will always be downwards to increasing layer depth.

Minimizing physical connections and allowing for only a single path from any vertex implies the multilateral well graph is to an acyclic graph. If a cycle exists in the graph, at least one node in the network will have two potential paths to the well origin. The minimum number of edges needed to connect V active vertices is well known to be E=V−1 active edges.

The described multilateral well graph has the properties according to graph theory of being rooted, strongly connected, and acyclic. These properties describe a directed-out rooted tree from which it follows that the optimal structure of a multilateral well is a rooted tree. It is a known result in optimization theory that the optimal solution to a network transshipment problem is a tree. In the event the network contains a single supply node, the solution would become a directed-out rooted tree with the single supply node as the root. According to the present invention, it has been found that well placement can be optimized by generation of a multilateral well as a transshipment problem.

It is important to note that the maximum cost and maximum length constraints described in the design requirements do not directly correspond to any standard transshipment constraint addressed during the model construction. Additionally, it is desirable to maximize the produced hydrocarbon while minimizing the cost of generating the network, so the objective function partially diverges from a standard transshipment objective function. Transshipment problems primarily address problems where "goods" need to be moved from supply nodes to demand nodes, and at a minimal cost. So a standard transshipment problem is formulated as minimization problem. In addition, the shipping cost associated with moving an item of goods scales linearly with the cost of moving the good through each edge.

In the transshipment approach of the present invention, there is a fixed cost associated with using a specified edge, analogous to developing a section of pipeline which has a fixed cost not depending on the amount of oil flowing through it as oil extraction takes place over a large period of time). In addition, standard transshipment models are only concerned with minimized cost; the present invention seeks to maximize profit based on penetrated completions (controlled by network flow constraints) while minimizing development cost by using the costs associated with pipeline development as stated previously.

It is to be noted that while identifying the optimum multilateral well trajectory that entails maximum hydrocarbon recovery, no constraints are made on maximum allowable hydrocarbon flow through any drilled section which can be investigated independently.

The subterranean network associated with an oil well must be strongly connected and must include the initial top point in an oil well (i.e. layer z=0) as a node to properly represent a practical oil well network. However, beyond this constraint the network is free to grow anywhere inside its domain as illustrated previously in FIG. 13. To allow the network to expand as would be most optimal, each node can enter into any adjacent node at most one vertical and/or horizontal movement away. Diagonal movements are allowed to model the slanted drilling approaches often used in practical scenarios between adjacent nodes. It is to be noted that all vertical depths for drilled sections subsequent to a point are monotonically increasing.

Formally, suppose $N' \in N$ and $C' \in C$ are the non-oil rich and oil rich nodes within the $L_1$ distance r around the oil well's origin, respectively. The nodes in which the oil well network can be formed are then $N' \cup C'$. Let $n=(i, j, k) \in N' \cup C'$ be an arbitrary node with coordinates $(i, j, k,)$. The nodes which can be connected to it are:

$$\{m \in N' \cup C' | m=(i+\delta_i, j+\delta_j, k+\delta_k), \delta_i \in \{-1,0,1\}, \delta_j \in \{-1,0,1\}, \delta_k \in \{0,1\}, |\delta_i|+|\delta_j|+|\delta_k|>0\}$$

This set of valid next nodes for a node n is denoted as $V_n$, in the vicinity of n. The set of valid edges for node n is then $E'_n = \{(n,m) | m \in V_n\}$, and thus the set of possible edges in the network is $\cup_{n \in N'} \cup_C E'_n = E'$.

Local Optimization

The transshipment model for single oil well network is as follows:

Sets

C' the set of oil-rich nodes (completions)
N' the set of oil-poor nodes
E' the set of edges between all nodes $N' \cup C'$ Parameters r the maximum network $L_1$ distance
Max Length the maximum network length
Max Cost the maximum network cost
$F_w$ the initial cost of drilling the oil well
$F_{nm}$: $(n,m) \in E'$ the cost of flow from node n to m
$L_{nm}$: $(n,m) \in F'$ the distance from node n to m
$P_c'$: $c \in C'$ the utility of completion Variables $X_w$ the flow from the oil well's origin (i.e. layer z=0) to the initial drill point (Integer)
$X_{nm}$: $(n, m) \in E'$ the flow from node n to m (Integer)
$Y_{nm}$: $(n, m) \in E'$ existence of flow from node n to m or node m to n (Boolean)
$Z_c$: $c \in C'$ penetration of completion c (Boolean)

Objective $$\text{Max} \sum_{c \in C'} Z_c \cdot P_c - \sum_{(n,m) \in E} Y_{nm} \cdot F_{nm} - F_w$$

Constraints

| | |
|---|---|
| $0 \leq X_w \leq |C|$ | 1.1. |
| $0 \leq X_{nm} \leq |C|$ | 1.2. |
| $Y_{nm} \in \{0,1\}$ | 1.3. |
| $Z_c \in \{0,1\}$ | 1.4. |
| $-\Sigma_{p:(n,p) \in E'} X_{np} + \Sigma_{m:(m,n) \in E'} X_{mn} = 0, n \in N'$ | 1.5. |
| $-\Sigma_{p:(n,p) \in E'} X_{np} + \Sigma_{m:(m,n) \in E'} X_{mn} - Z_n = 0, n \in C'$ | 1.6. |
| $X_{nm} - |C| \times Y_{nm} \leq 0, (n,m) \in E'$ | 1.7. |
| $\Sigma_m Y_{nm} \leq \text{MaxMBBreadth}, n \in (E' \cup C') \cap \{(i,j,k') | k' \in \{1, \ldots, z\}\}$ | 1.8. |
| $\Sigma_m Y_{nm} \leq \text{MaxLatBreadth}, n \in (E' \cup C') / \{(i,j,k') | k' \in \{1, \ldots, z\}\}$ | 1.9. |
| $F_w + \Sigma_{(m,n) \in E'} F_{nm} \times Y_{nm} \leq \text{MaxCost}$ | 1.10. |
| $\Sigma_{(m,n) \in E'} L_{nm} \times Y_{nm} \leq \text{MaxLength}$ | 1.11. |

The general methodology is to treat the transshipment variables $X_{nm}$ as standard, but to account for the drilled well sections cost and length via the $Y_{nm}$ variables, which indicate active drilled well sections in the network. To encourage profit maximization, the $Z_c$ variables indicate when a completion has been penetrated. To ensure that the network is constructed with a connection to the oil well's origin $X_w$, and that the supply node is limited to only the oil well's node, meaning no $Z_c$ variable can be nonzero without requiring $X_w>0$ due to requiring 0 residual flows at all transshipment nodes. Note that $X_w$ and $X_{nm}$ are listed as Integer variables and $Z_c$ and $Y_{nm}$ are listed as Boolean. Practically, $Z_c$ will always reach its maximum value any time it can be active as only $Z_c$ adds positive utility to the objective function.

The relationship between $X_{nm}$ and $Z_c$ insures integrality of $X_{nm}$, which in turn insures integrality of $X_w$. Thus these variables can be considered continuous with only $Y_{nm}$ not guaranteed integrality. This means the transshipment model is a mixedD integer program. An illustration of an oil well that can be constructed using the above formulations in an optimum network form can be found in FIG. 15.

Figure 15:
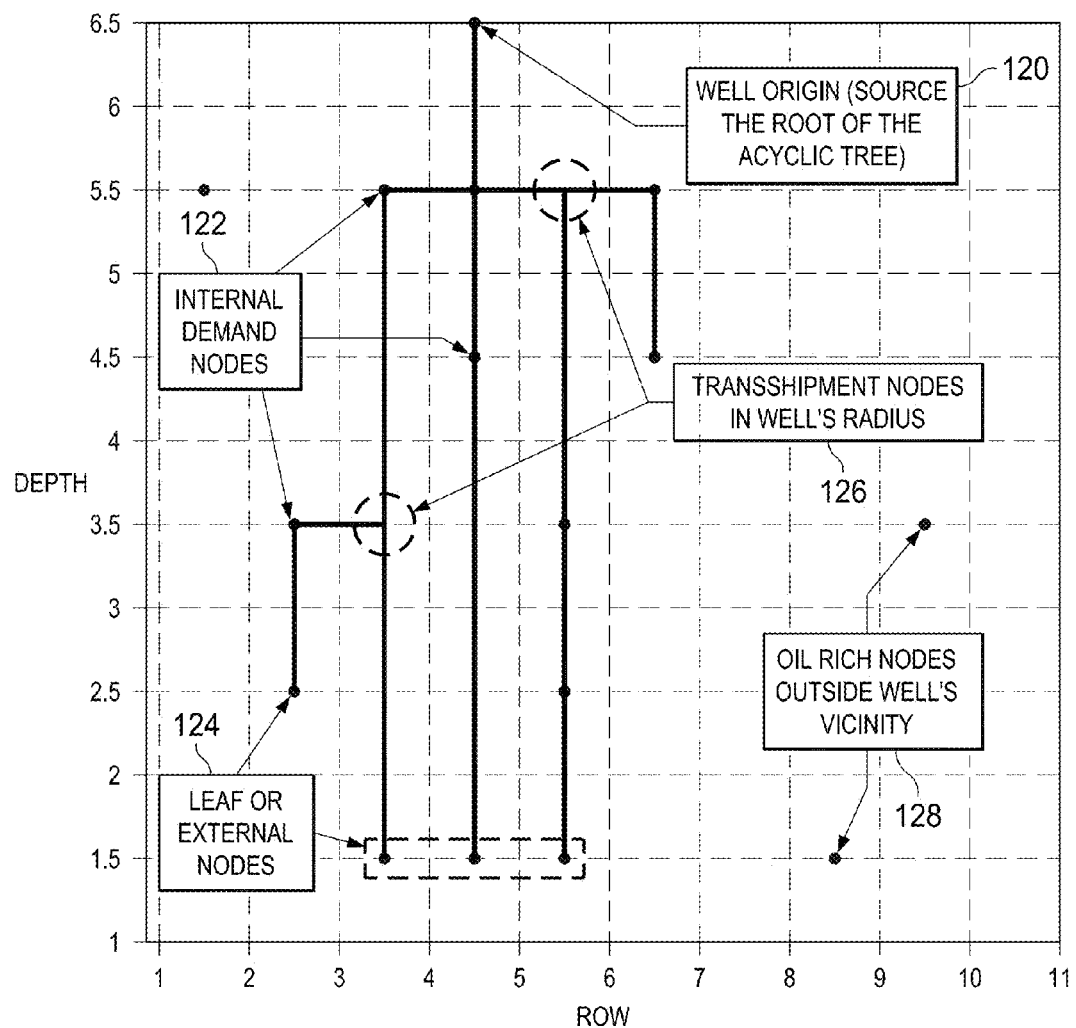
FIG. 15 is a schematic diagram of a cross-section of an oil well constructed by multilateral well placement according to the present invention.

FIG. 15 is a cross-sectional schematic diagram of an oil well constructed via the transshipment approach according to the present invention. A well origin 120 serves as the source node or root of the well. The source node 120 is a supply node, and serves as the only supply node in the network. The well extends downwardly to internal demand nodes 122, which must be connected to the supply node 120. The well ends at leaf or external nodes 124 which are also demand nodes. The leaf nodes 124 are also completions. There are non-completion nodes or transshipment nodes 126 where in effect a lateral well extends from another well. Oil rich nodes are indicated at 128 outside the distance constraints of the well, as discussed above with respect to FIG. 14.

Figure 16:
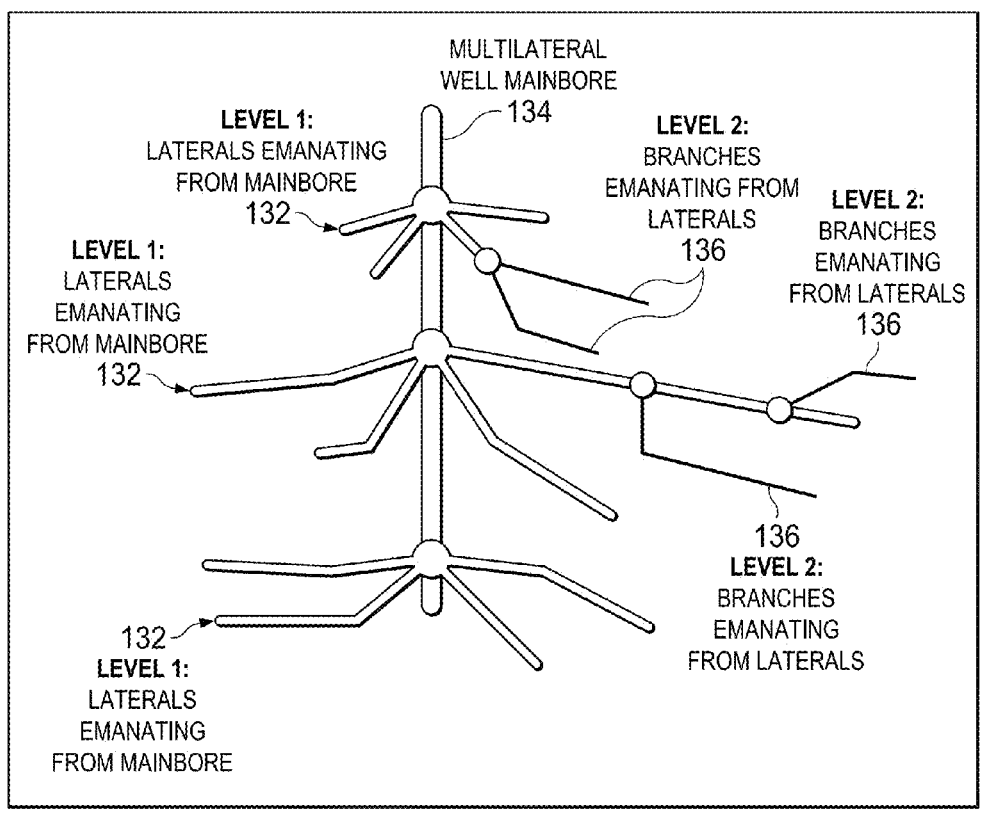
FIG. 16 is a schematic diagram of branching breadth control in multilateral wells during construction by multilateral well placement according to the present invention.

In addition, constraints 1.8 and 1.9 are responsible for controlling the number of branches on two different levels of nodes. For instance, the main bore of a multilateral well is considered as first level of nodes which shares the same i and j coordinates with different k values. The second level includes all the nodes away from the main bore coordinates. FIG. 16 shows the two levels discussed to control the branching breadth in a multilateral well. As indicated at 132, level 1 nodes include laterals emanating from main or ML well bore 134. As indicated at 136, level 2 includes branches emanating from lateral or subsequent sections. The last two constraints (1.10 and 1.11) are responsible for limiting the size of the multilateral well as well as the construction cost associated.

Global Multilateral Well Optimization

The present invention also provides for single well construction to be replicated to populate variable optimum well designs into the reservoir of interest. The small size of an individual oil well network relative to the entire reservoir means that a reservoir is likely to require multiple oil wells to maximize the profit which can be gained. Before detailing the considerations for global multilateral wells optimization, user defined parameters are summarized in Table 3 which include multilateral well specification in local, global, initial well location criterion, and computation size terms.

TABLE 3

| User defined multilateral wells optimization parameters | |
|---|---|
| Local multilateral well | 1. Maximum Well Length |
| | 2. Maximum individual well cost |
| | 3. Well expansion range |
| | 4. Maximum number of branches per node level |

TABLE 3-continued

| User defined multilateral wells optimization parameters | |
|---|---|
| Global multilateral wells | 1. Maximum number of wells |
| | 2. Maximum reservoir development cost |
| | 3. Minimum distance between well origins |
| Initial Well Point Criterion | Minimum number of completion points per column |
| Computational Size | Number of completion points per layer. |

Multiple Well Placement Design Considerations

In a 3-Dimensional (x×y×z) reservoir, there are x×y possible sites to place new wells. Many of these may be of low utility relative to other oil well placements.

There are many practical limitations for oil well placement, in particular the allowable costs associated with entire development project or a limit on the number of wells which can be constructed.

Two oil wells could potentially compete for two or more of the same completions. The utility for penetrating a completion can only occur once as penetrating the node twice does not increase the amount of oil to be gained from that node. This means the optimal drilled well sections network cannot be considered independently in many situations.

Two oil wells cannot ever physically overlap, i.e. one piece of drilled sections cannot be associated with two oil wells.

The distance from an oil well site to another oil well site may have a desired minimum distance depending on the application, denoted MinDist.

To address locating high productivity wells, a simple heuristic is utilized to identify high-utility oil wells starting locations. Consider starting oil well location (i,j,0). If |{k: (i,j,k)∈C}|>η, where η> is a user-defined constant, then (i,j,0) is a viable placement location for an oil well. Other heuristics to identify oil well placement locations can also easily be used. Denote the set of all viable starting oil well locations as S. Let the number of viable oil well locations under this heuristic be W>0, noting that each of these locations has an associated model. These models inherit all the sets, parameters and variables from the transshipment model described above. Denote each of these models $M_\alpha$, $\alpha \in \{1, \ldots, W\}$, and the set of all models M.

To address the well placement limitations, a user defines an upper bound on the number of wells which can be constructed, denotes MaxWells, and a maximum global project cost, denoted MaxGlobalCost. To address the remaining design considerations, the following global optimization problem is proposed.

Global Well Placement Optimization Sets

C the global set of oil-rich nodes (completions)

N the global set of oil-poor nodes

S the set of viable oil well placement locations

M the set of models for all viable oil well placement locations.

$C^\alpha$ the set of oil-rich nodes (completions) for model a $N^\alpha$ the set of oil-poor nodes for model a

Parameters r the maximum network radius
Max Wells the maximum number of wells which can be built
MaxGlobal Cost the maximum cost for construction on the entire reservoir
MinDist the minimum required $L_1$ distance between two oil well's origin

Variables $X_w^\alpha$ the flow from the oil well's origin to the initial drill point for model $\alpha$ (Integer)
$Y_w^\alpha$ active placement of an oil well for model $\alpha$ (Boolean)
$F_w^\alpha$ the initial cost of the oil well for model $\alpha$
$X_{nm}^\alpha$: (n, m)$\in E^\alpha$ the flow from node n to m for model $\alpha$ (Integer)
$Y_{nm}^\alpha$: (n, m)$\in E^\alpha$ existence of flow from node n to m or node m to n for model $\alpha$ (Boolean)
$Z_c^\alpha$: (n,m)$\in E^\alpha$ penetration of completion c for model $\alpha$ (Boolean)

Objective $$\text{Max}\Sigma_{\alpha=1}^W (\Sigma_{c \in C}^\alpha Z_c^\alpha \times P_c - \Sigma_{(n,m) \in E}^\alpha Y_{nm} \times F_{nm} - Y_W^\alpha \times F_W^\alpha)$$

Constraints $0 \leq X_w^\alpha \leq |C^\alpha|, \forall \alpha \in \{1, \ldots, W\}$ $\Sigma_{p:(n,p) \in E}^\alpha X_{np}^\alpha + \Sigma_{m:(m,n) \in E}^\alpha X_{mn}^\alpha = 0, n \in N^\alpha, \forall \alpha \in \{1, \ldots, W\}$  1.2.

$\Sigma_{p:(n,p) \in E}^\alpha X_{np}^\alpha + \Sigma_{m:(m,n) \in E}^\alpha X_{mn}^\alpha - Z_n = 0, n \in C^\alpha, \forall \alpha \in \{1, \ldots, W\}$  1.3.

$X_{nm}^\alpha + X_{mn}^\alpha - 2|C^\alpha| \times Y_{nm}^\alpha \leq 0, (n,m) \in E^\alpha, \forall \alpha \in \{1, \ldots, W\}$  1.4.

$F_w^\alpha \times Y_w^\alpha + \Sigma_{(n,m) \in E}^\alpha F_{nm} \times Y_{nm} \leq \text{MaxCost}, \forall \alpha \in \{1, \ldots, W\}$  1.5.

$\Sigma_{(n,m) \in E}^\alpha L_{nm} \times Y_{nm}^\alpha \leq \text{MaxLength}, \forall \alpha \in \{1, \ldots, W\}$  1.6.

$\Sigma_{\alpha=1}^W (F_w^\alpha \times Y_w^\alpha + \Sigma_{(n,m) \in E}^\alpha F_{nm} \times Y_{nm}^\alpha) \leq \text{MaxGlobalCost}$  1.7.

$\Sigma_{\alpha=1}^W Y_{nm}^\alpha \leq 1, \{\alpha | (n,m) \in E^\alpha\}$  1.8.

$\Sigma_{\alpha=1}^W Z_c^\alpha \leq 1, \{c | c \in C^\alpha\}$  1.9.

$\Sigma_{\alpha=1}^W Y_w^\alpha \leq \text{MaxWells}$  1.10.

$\Sigma_{s \in S} Y_{w'}^s \leq 1, S' = \{s' \in S | L_1(s,s') < \text{MinDist}\}, \forall s \in S$  1.11.

The first six constraints above are repeated from the local optimization model and are rewritten to illustrate the dependence on the structure of the individual models. The seventh constraint concerns the total global cost constraint and bounds the total cost for all active drilled sections below a fixed value. The eighth constraint ensures that two pieces of drilled sections from different models but in the same location are never to be active simultaneously, preventing physical overlap of the models. The ninth constraint ensures that an optimal completion is only penetrated once in the entire reservoir model, ensuring both no overlap of models and an accurate objective function which can be illustrated in FIGS. 17 and 18.

Figure 17:
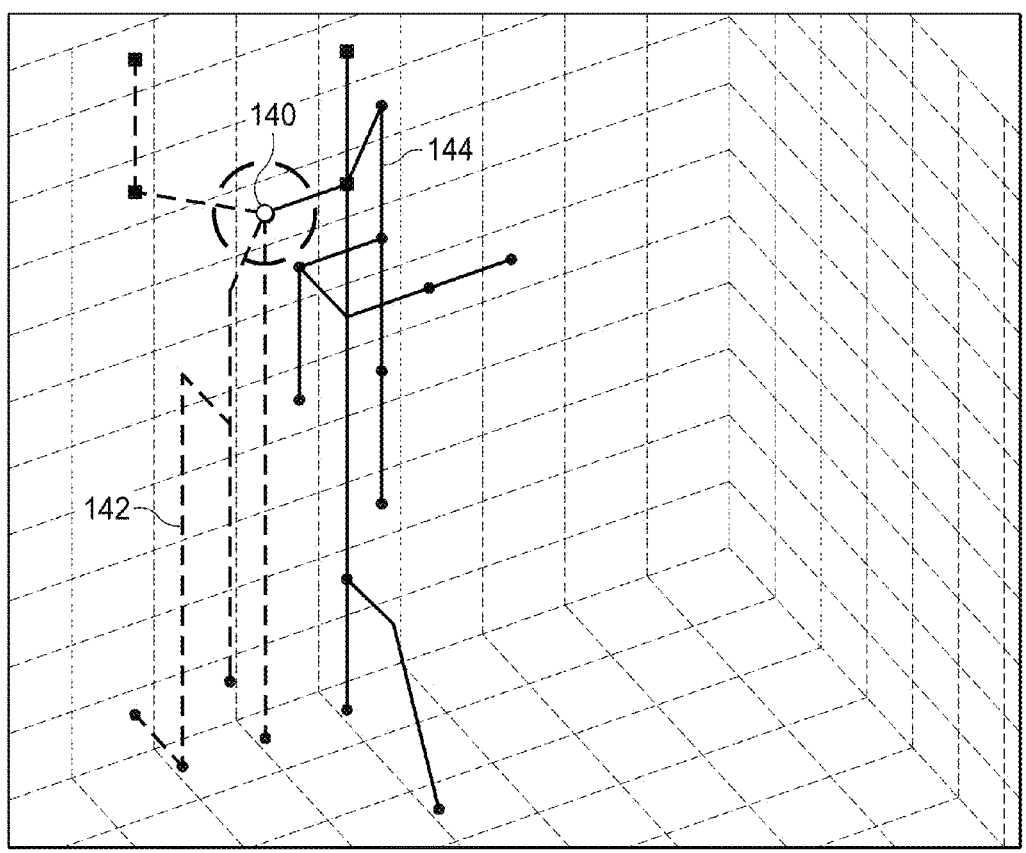
FIGS. 17 and 18 are schematic diagrams illustrating elimination of overlap possibilities between two wells by global constraints during multilateral well placement according to the present invention.
Figure 18:
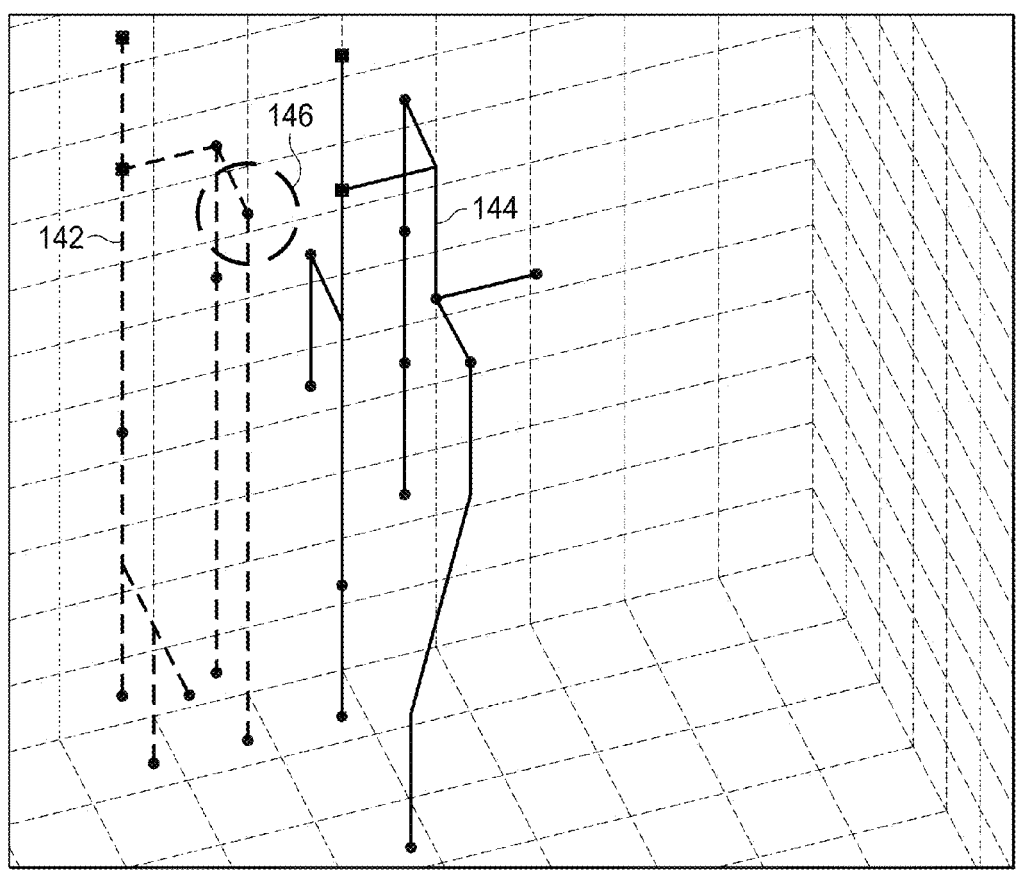

As indicated in FIG. 17, an overlap is illustrated at completion point 140 between two cells 142 and 144, which might occur without the ninth constraint. FIG. 18 illustrates an optimum design resulting according to the present invention. As indicated at 146, the possibility of overlap between wells 142 and 144 is prevented.

Figure 19:
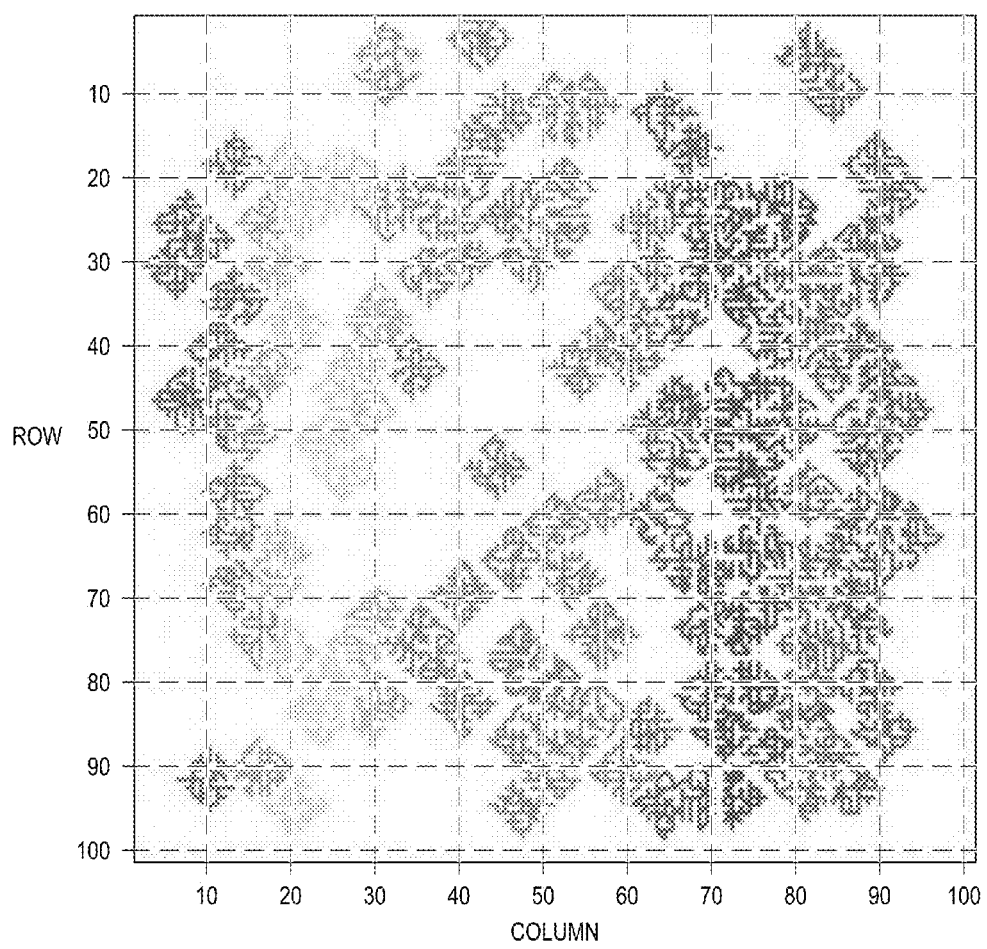
FIG. 19 is a schematic diagram in top view of a number of multilateral wells developed during multilateral well placement according to the present invention.

The tenth constraint ensures the number of active oil drilled wells is within the desired MaxWells constraint. The eleventh constraint addresses the final item from the above list by ensuring a minimum distance between the oil drilled wells locations. These additional constraints join all the previously independent models to cohesively address the overlap concerns. FIG. 19 illustrates schematically the propagation of 200 multilateral wells in oil reservoir to form multilaterals with a 45° square prism in shape. The rotated prism shape results from honoring the radius r (FIG. 14) of extent discussed above.

The foregoing description has been of simplified models for the present invention. It should be understood that the present invention can be used for well placement of multiple multilateral wells in large scale reservoirs with a large number of wells such as that shown in U.S. Pat. Nos. 7,596,480 and 8,437,999 discussed above.

Divide and Conquer for Global Optimization

For problems of a small size, global optimization can be solved to optimality reasonably quickly, even without a large amount of computational resources. As the problem increases in complexity, whether it can be an increase in reservoir size or an increase in the number of desired wells, the computational cost of the problem can increase significantly. This is reflected in the resulting size of the linear program itself; it can be on the order of hundreds of thousands of constraints. The computational time for linear programming problems very frequently increases as the size of the model increases, due to the size of the matrix computations that need to be performed.

Hence, to reduce the computational cost of the global optimization problem, reducing the size of the problem can have a large effect. To reduce the size of the optimization problem, what can be considered a Divide and Conquer approach is used to partition the global problem into self-contained sub problems.

In general, Divide and Conquer strategy works in three steps:

a) Breaking the large problem into subproblems while inheriting the same properties;

b) Solving the subproblems recursively; and c) Combine the partitioned solutions.

The partition must take into account two properties of the global optimization problem. First, two oil wells cannot reach the same optimal completions. Thus, two deferent models which share an optimal completion must be in the same subproblem. Second, two viable oil wells' origin points, which fall within MinDist of each other, must have the mutual exclusion property. Thus, two deferent models with starting points within MinDist must be in the same subproblem. To partition the problem, the following algorithm is used to construct the partition.

Algorithm 1

Generation of Minimal Boolean Equation

---

Inputs: M, the set of all models
    {$C^\alpha | \alpha \in \{1, \cdots, W\}$}, the set of completions for each model
    S, the set of model oil rig placement locations
Output: P, the partition of the global problem as a set of sets
P := ∅
I := {1, •••, W}
P' : = Pop(I)
while I ≠ ∅ do
    P* : = P'
    for i ∈ I do
        if $C^i \cap (\cup \alpha \in P')C^\alpha) \neq \emptyset$ or $\min_{\alpha \in P'} D(S^i, S^\alpha) \leq$ MinDist then
            P' : = P' ∪ i
            I : = I\i
        else
            if $\min_{\alpha \in P'} D(S^i, S^\alpha) \leq$ MinDist then
                P' := P' ∪ i
                I := I\i
            end if
        end if
    end for
    if P' = P* then
        P := P ∪ {P' }
        P' := Pop (ℂ)
    end if
end while

---

The result set P is an ensemble of sets, where each set in P is a collection of model indices which represent a single self-contained subproblem which can be optimized in the same method as the global solution.

In other words, the model design of the subproblem is identical to the global optimization problem. However, this raises a new concern. The solution set to the global optimization problem will be |P| independent sets of active models, where each set satisfies MinDist; MaxWells and MaxGlobalCost constraints and each active model satisfies the MaxLength and MaxCost constraints.

Furthermore, each active oil well drilling platform will have an optimal drilling network associated with it which determines how best to build penetrations for the completions within its radius. Since each problem was optimized with the above constraints, it is possible that simply taking the union of all active models would violate either the MaxCost or MaxWells constraints.

However, because the models satisfy the MinDist constraint and the overlap constraints, the individual models arriving from solutions to the subproblems can be combined directly by taking the union of the active oil wells drilling platforms and drilled sections of pipeline. The problem then reduces to selecting from amongst the active models an optimal subset of oil wells drilling platforms that maximize the global objective function while still satisfying the MaxWells and MaxGlobalCost constraints.

Suppose there are p active models among the |P| different subproblems. Denote the optimal objective value and construction costs for each active oil rig drilling platform as $z^\beta$ and $c^\beta$ respectively, where $\beta \in \{1, \ldots, \rho\}$. The following optimization problem solves this selection problem.

Sets $z^\beta$ the optimal objective value for model $\beta$
$c^\beta$ the cost of construction for model $\beta$ Parameters MaxWells the maximum number of wells which can be built
MaxGlobal Cost the maximum cost for wells construction on the entire reservoir Variables $\gamma^\beta$ inclusion of model $\beta$ in the optimal set of models Objective $$\text{Max} \Sigma_{\beta=1}^\rho (z^\beta \times y^\beta) \tag{4}$$

Constraints $$y^\beta \in \{0,1\}, \beta \in \{1, \ldots, \rho\} \tag{5.1}$$

$$\Sigma_{\beta=1}^\rho y^\beta \leq \text{MaxWells} \tag{5.2}$$

$$\Sigma_{\beta=1}^\rho c^\beta \leq \text{MaxGlobalCost} \tag{5.3}$$

Multilateral Wells Placement Optimization

Figure 20:
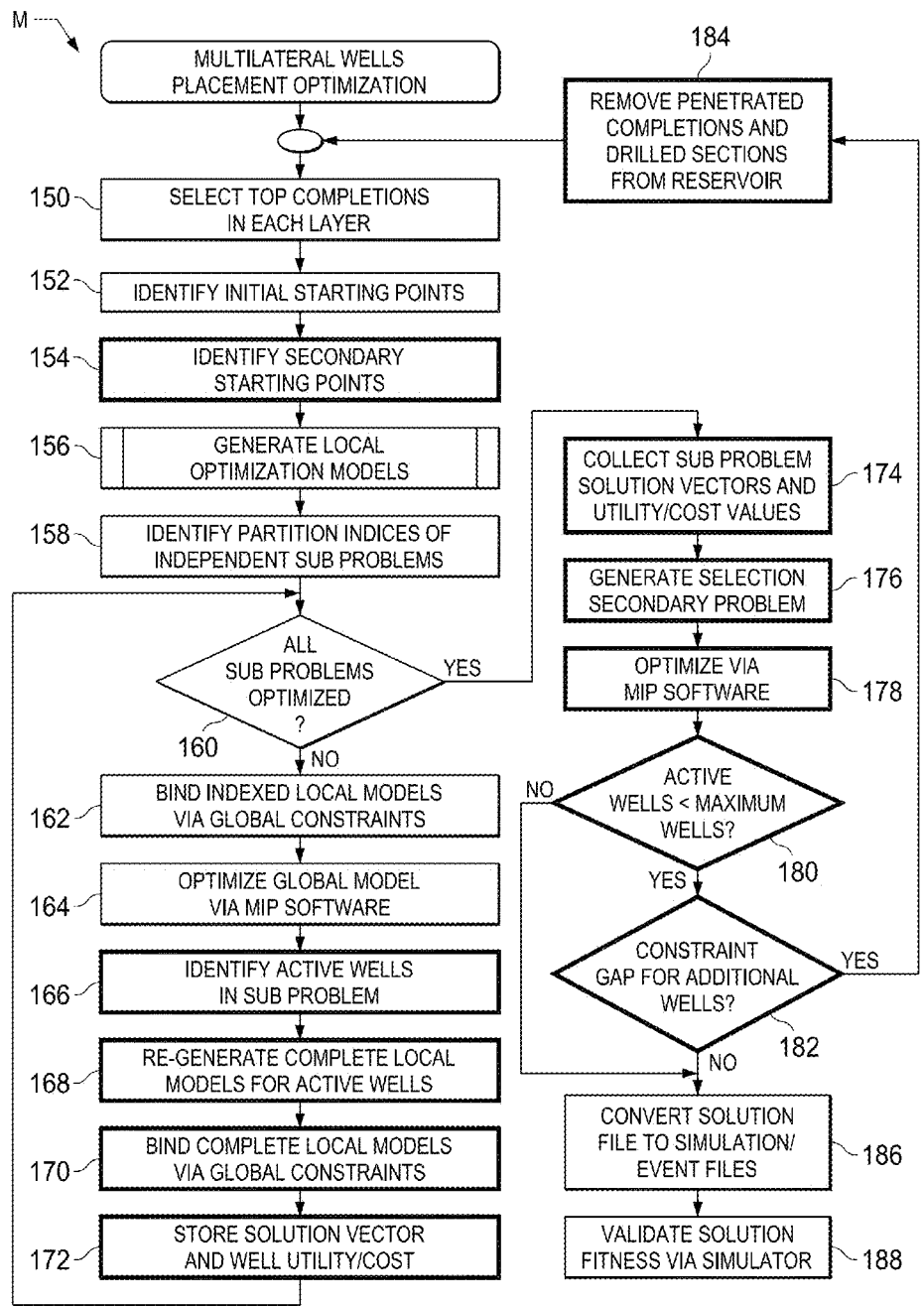
FIG. 20 is a functional block diagram of a flow chart of data processing steps for optimization of multilateral well placement according to the present invention.

The final multilateral wells optimization framework is depicted in FIG. 20 where the complete process is illustrated in a schematic diagram of a flow chart M of data processing steps performed according to the present invention in the data processing system D.

During the placement of multiple multilateral as shown in FIG. 20, in step 150 top completions are selected in each layer of interest in the reservoir. Step 152 involves identifying initial starting points for the wells, and in step 154 secondary starting points are identified.

The initial set of starting points is formed during step 152 based on concurrent completions in the same x-y location in the reservoir. Secondary constraints are typically suggested and selected in step 154 based on other processing and aim to find other high value locations for the initial drill site.

During step 156, local optimization models for a multilateral well design are generated in the manner described above and during step 158 partition indices of independent subproblems are identified according to the Generation of Minimal Boolean Equations methodology described above.

In step 160, a determination is made whether each of the subproblems has been optimized. If not, during step 162 the indexed local models are bound via global constraints. Each individual local model can build an insular multilateral well, the "binding" describes equations used to prevent potentially competing models from overlapping. This allows models to be built near each other in high value regions while avoiding physical overlap of wells, and thus invalid solutions. Then, during step 164 the global model is optimized by Mixed Integer Processing or MIP. The Mixed Integer Processing may be performed by Guropi MIP processing or by IBM CPLEX techniques, for example.

During step 166, the active wells in a subproblem are identified and in step 168 complete local models for the identified active wells are regenerated. In step 170, the completed local wells are bound via global constraints in the manner of step 162 above. In step 172, the solution vector determined by MIP techniques for the matrix, and the well profit (or utility) and cost for each of the identified active wells are stored in memory of the data processing system D. These are the solutions and values found after optimizing the local models bound via global constraints. Processing then returns to step 160.

If during step 160 all subproblems are indicated to have been optimized, processing proceeds to step 174, during which the subproblem solution vectors and utility/cost values are collected. During step 176, a solution secondary problem is selected according to Equations 5.1, 5.2, and 5.3 above, and during step 178 the solution secondary problem is optimized by Mixed Integer Processing of the types described above.

During step 180, a determination is made whether the number of active wells is less than the maximum number of wells Max Wells, and if so, processing proceeds to step 182 where a determination is made whether there is a possibility of additional wells without exceeding the MaxGlobal Cost value. If so, processing continues to step 184 where the penetrated completions and drilled sections are removed from the reservoir model and processing returns to step 150.

If during either of steps 180 or 182, either the Max Wells or MaxGlobal Cost values are indicated as reached, processing continues to step 186 where the determined solution file is converted to simulation event files. Next, in step 188 the fitness of the determined solution is tested and verified by reservoir simulation processing in the data processing system D.

Placing production wells in hydrocarbon fields should not be an intuitive decision to make since it requires a costly drilling rig operation. Multilateral wells are more expensive to drill and require careful utilization of sophisticated drilling technology to place the wells precisely on the optimum production locations, or sweet spots, in a hydrocarbon reservoir in such a way that each section of the multilateral well is penetrating a cost justified hydrocarbon pocket. The present invention provides a quantifiable mathematical justification for trajectories of many multilateral wells with different designs to allow optimal field performance and exploitation for the hydrocarbon reservoirs.

Figure 21:
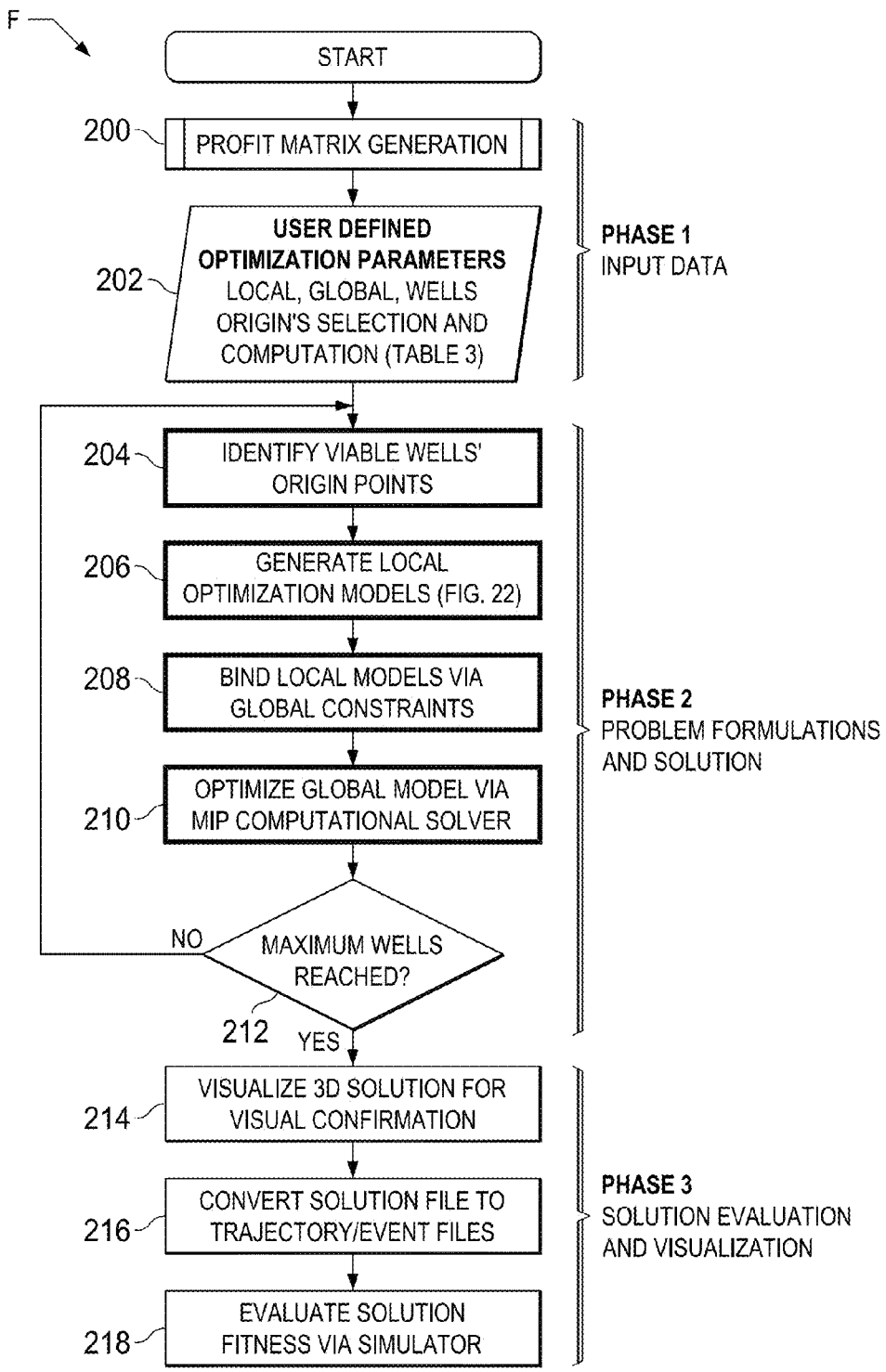
FIG. 21 is a functional block diagram of a flow chart of data processing steps for multilateral well placement according to the present invention.

The process of placing multilateral wells according to the present invention is indicated schematically in a flow chart F (FIG. 21). This process describes construction of the appropriate equations for a single local model. In the process of the global optimization, numerous local models are generated. Hence these steps can be repeated multiple times.

Phase 1: Input Data

As part of data input, a sweet spot identification system is used to guide the optimization process. As has been discussed, profit measure according to the present invention. During step 200, profit matrix generation processing is performed to generate profit measures $P_c$ as illustrated in FIG. 1.

During step 202, reservoir parameters are defined, such as reservoir model dimensions, cells measurements, reservoir depth and layers thickness, and cost to drill in vertical and horizontal planes. During step 202, multilateral wells optimization parameters for transshipment processing in the manner described above are also provided as inputs.

Phase 2: Problem Formulations and Solution

Optimization begins in step 204 by collecting the input data and identifying the viable well origin points for the number of wells specified. The local optimization models for multilateral wells are then generated during step 206, which is illustrated in more detail in FIG. 22, as will be described.

After completing the local optimization loop during step 206, the optimization processing during step 208 binds the local models by the global constraints that, as described above, apply the following process:

a) Ensure that the cost of total number of wells is within allowed budget;
b) Prevent physical overlap between local models by ensuring that two pieces of drilled sections from different models but in the same location will not be active simultaneously;
c) Guarantee that each optimal completion is traversed only once to eliminate overlap between models and to ensure accurate objective function;
d) Ensuring the desired number of wells is found;
e) Allow minimum distance between multilateral wells origin.

After binding the local models to the global constraints during step 208, the problem is optimized via MIP computation during step 210. During step 212, it is determined whether the maximum number of wells Max Wells has been reached. If not, processing returns to step 206. If so, processing proceeds for solution evaluation and visualization.

Phase 3: Solution Evaluation and Visualization

Once an optimum solution is determined, the generated multilateral wells are visualized during step 214 by viewing the results produced by the data processing system D. as an analysis post-optimization tool to check the quality of the wells. During step 216, the resultant solution files are converted to trajectory/event files, and the trajectory of the multilateral wells can be exported which can be checked using a suitable pre-simulation tool. As indicated at step 218, simulation runs with the generated multilateral wells can be performed to evaluate the solution fitness, and performance and applicability.

Figure 22:
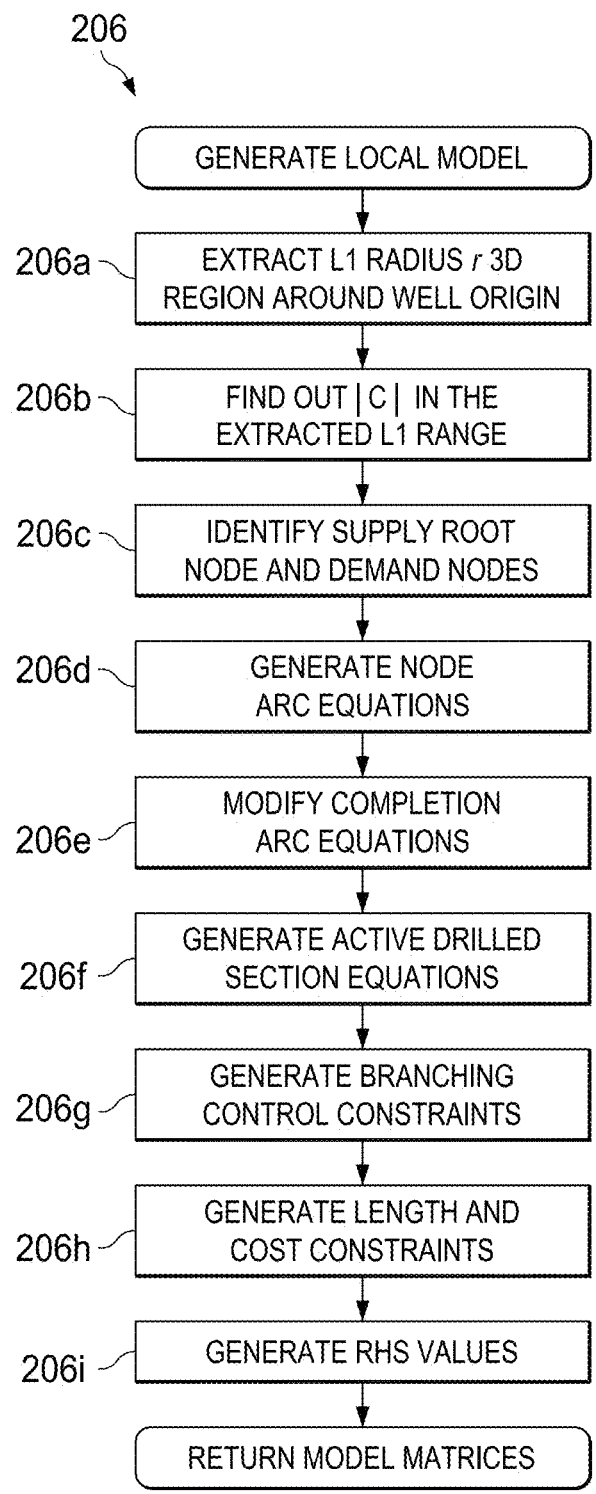
FIG. 22 is a functional block diagram of a flow chart of data processing steps for local transshipment processing during multilateral well placement according to the present invention.

Generating a local model in step 206 of FIG. 21 is illustrated in more detail in FIG. 22. During step 206a, the L1 radius r 3D region around the well origin discussed above with respect to FIG. 14 is extracted based on the assigned radius. For every extracted region, during step 206b the number of completion points contained is found. The number of completion points indicates the amount of flow in the transshipment problem to be shipped from the root node to the demand nodes in the region. During step 206c, the supply root node and demand nodes are identified.

The rooted tree, which is cycle free, is generated in each local model by constructing the equations of the edges during step 206d for node arc equations (1.5 above) and during step 206e for modifying completion arc equations (1.6). Optimum completion points are treated as sink nodes with demand value of 1. The non-completion nodes are treated as transshipment nodes with net amount of zero.

After generating the rooted trees, active drilled sections which connect optimum completion points are identified and a new set of active drilled section equations (1.7) are generated during step 206f. Branching control constraints for multilateral wells are generated during step 206g. Two levels of branching control can be performed as described above. During step 206h, maximum length and cost for drilling multilateral well constraints equations are generated in each local model, and during step 206*i* RHS (Right Hand Side) values or solutions of the constraint equations are generated.

Data Processing System

Figure 23:
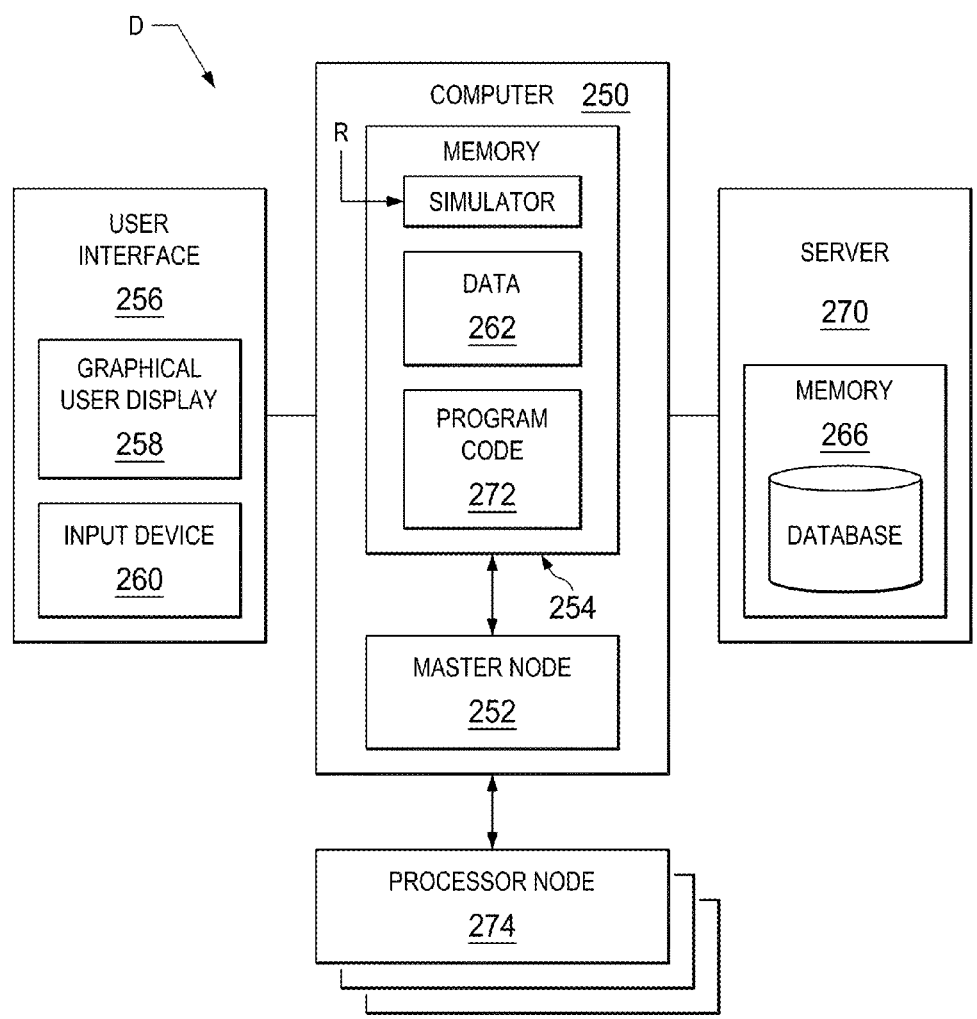
FIG. 23 is a schematic diagram of a data processing system for multilateral well placement according to the present invention.

As illustrated in FIG. 23, the data processing system D includes a computer 250 having a master node processor 252 and memory 254 coupled to the processor 252 to store operating instructions, control information and database records therein. The data processing system D may be a multicore processor with nodes such as those from Intel Corporation or Advanced Micro Devices (AMD), an HPC Linux cluster computer or a mainframe computer of any conventional type of suitable processing capacity such as those available from International Business Machines (IBM) of Armonk, N.Y. or other source. The data processing system D may also be a computer of any conventional type of suitable processing capacity, such as a personal computer, laptop computer, or any other suitable processing apparatus. It should thus be understood that a number of commercially available data processing systems and types of computers may be used for this purpose.

The processor 252 is accessible to operators or users through user interface 256 and is available for displaying output data or records of processing results obtained according to the present invention with an output graphic user display 258. The output display 258 includes components such as a printer and an output display screen capable of providing printed output information or visible displays in the form of graphs, data sheets, graphical images, data plots and the like as output records or images.

The user interface 256 of computer 250 also includes a suitable user input device or input/output control unit 260 to provide a user access to control or access information and database records and operate the computer 250. Data processing system D further includes a database 262 of reservoir parameters and user defined optimization parameters and other reservoir and well data stored in computer memory, which may be internal memory 254, or an external, networked, or non-networked memory as indicated at 266 in an associated database server 90.

The data processing system D includes program code 272 stored in non-transitory memory 254 of the computer 250. The program code 272 according to the present invention is in the form of computer operable instructions according to the flow charts C (FIG. 1), M (FIG. 20) and F (FIG. 21), causing the data processor 250 to perform multilateral well placement via the transshipment approach according to the present invention in the manner that has been set forth.

The computer memory 254 also contains stored computer operating instructions in the non-transitory form of Reservoir Simulator Module R, and also the data from data base 262 being manipulated and processed by the processor 252.

It should be noted that program code 272 may be in the form of microcode, programs, routines, or symbolic computer operable languages that provide a specific set of ordered operations that control the functioning of the data processing system D and direct its operation. The instructions of program code 272 may be stored in memory 254 of the data processing system D, or on computer diskette, magnetic tape, conventional hard disk drive, electronic read-only memory, optical storage device, or other appropriate data storage device having a computer usable non-transitory medium stored thereon. Program code 272 may also be contained on a data storage device such as server 270 as a non-transitory computer readable medium, as shown.

The data processing system D may be comprised of a single CPU, or a computer cluster as shown in FIG. 23, including computer memory and other hardware that makes it possible to manipulate data and obtain output data from input data. A cluster is a collection of computers, referred to as nodes, connected via a network. Usually a cluster has one or two head nodes or master nodes 252 that are used to synchronize the activities of the other nodes, referred to as processing nodes 274. The processing nodes 274 all execute the same computer program and work independently on different segments of the grid which represents the reservoir.

Processing according to the present invention has been used according to instructions written in Matlab language. The models were solved using standard Guropi MIP mathematical computations applications. The data processing system used in performing the computations has a 2.4 GHz CPU with 32 GB RAM nodes. To facilitate a user interaction with the multilateral wells generation process, a graphical user interface (GUI) is utilized to specify input parameters described above, and also used as an analysis tool to visualize the generated multilateral wells and observe their consistency.

With the present invention, design and placement for multilateral wells is not required to be unified throughout a reservoir. Multilateral well placement design can be varied based on the recommendations obtained from sweet spot or higher productivity identification techniques. The present invention links two important features (sweet spots identification and well placement optimization) which are necessary to effectively deploy multilateral wells in an oil reservoir.

Although embodiments of the present invention has been described in detail, it should be understood that various changes, substitutions, and alterations can be made hereupon without departing from the principle and scope of the invention. Accordingly, the scope of the present invention should be determined by the following claims and their appropriate legal equivalents.

Moreover, the foregoing has broadly outlined certain objectives, features, and technical advantages of the present invention and a detailed description of the invention so that embodiments of the invention may be better understood in light of features and advantages of the invention as described herein, which form the subject of certain claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages are better understood from the description above when considered in connection with the accompanying Figures. It is to be expressly understood, however, that such description and Figures are provided for the purpose of illustration and description only and are not intended as a definition of the limits of the present invention. It will be apparent to those skilled in the art that various modifications and changes can be made within the spirit and scope of the invention as described in the foregoing specification.

What is claimed is:

1. A computer implemented method of formulating well completions of at least one multilateral well in a subsurface reservoir producing hydrocarbon fluids, the reservoir being organized as a reservoir model partitioned into a number of cells, the computer implemented method comprising the steps of:

performing a reservoir simulation to determine hydrocarbon fluid content of the cells in reservoir model;

forming a measure of expected cumulative production for the cells based on productivity of the determined hydrocarbon fluid content of the cells;

generating a model for the at least one multilateral well by transshipment network analysis of the measures of expected cumulative production to maximize produced hydrocarbons for the cells;

optimizing placement of the generated model of the at least one multilateral well in the reservoir model; and forming an output display of the at least one multilateral well at a location in the reservoir model according to the step of optimizing placement; and placing the at least one multilateral well in the subsurface reservoir according to the location in the reservoir model formed in the output display.

2. The computer implemented method of claim 1, wherein the step of forming a measure of expected cumulative production comprises the step of forming a matrix for the cells of the reservoir model.

3. The computer implemented method of claim 1, wherein the step of optimizing placement is performed by mixed integer processing.

4. The computer implemented method of claim 1, wherein well completions of a plurality of multilateral wells are formulated and wherein:

the step of generating comprises generating a model for the plurality of multilateral wells by transshipment network analysis of the measures of expected cumulative production to maximize produced hydrocarbons for the cells;

the step of optimizing placement comprises optimizing placement of the generated model of the plurality of multilateral wells in the reservoir model; and the step of forming an output display comprises forming an output display of the plurality of multilateral wells at locations in the reservoir model according to the step of optimizing placement.

5. The computer implemented method of claim 1, wherein the hydrocarbon fluids comprise oil and gas.

6. The computer implemented method of claim 5, wherein the step of performing a reservoir simulation further comprises determining water content of the cells in the reservoir model.

7. The computer implemented method of claim 6, wherein the step of forming a measure of expected cumulative production comprises the step of:

forming a measure of expected cumulative production for the cells based on productivity of the determined hydrocarbon fluid and water content of the cells.

8. The computer implemented method of claim 1, wherein the step of optimizing placement comprises optimizing placement by local optimization of the generated model of the at least one multilateral well in the reservoir model.

9. The computer implemented method of claim 1, wherein the step of optimizing placement comprises optimizing placement by global optimization of the generated model of the at least one multilateral well in the reservoir model.

10. The computer implemented method of claim 9, wherein the step of optimizing placement by global optimization includes the steps of:

partitioning the global optimization into plural subproblems having common properties;

recursively solving the partitioned subproblems to form partitioned solutions; and combining the partitioned solutions.

11. A data processing system for formulating well completions of at least one multilateral well in a subsurface reservoir producing hydrocarbon fluids, the reservoir being organized as a reservoir model partitioned into a number of cells, the data processing system including:

a processor performing steps of:

performing a reservoir simulation to determine hydrocarbon fluid content of the cells in the reservoir model;

forming a measure of expected cumulative production for the cells based on productivity of the determined hydrocarbon fluid content of the cells;

generating a model for the at least one multilateral well by transshipment network analysis of the measures of expected cumulative production to maximize produced hydrocarbons for the cells;

optimizing placement of the generated model of the at least one multilateral well in the reservoir model; and a user interface performing the step of:

forming an output display of the at least one multilateral well at a location in the reservoir model according to the optimized placement; and placing the at least one multilateral well in the subsurface reservoir according to the location in the reservoir model formed in the output display.

12. The data processing system of claim 11, wherein the processor in forming a measure of expected cumulative production performs the step of forming a profit matrix for the cells of the reservoir model.

13. The data processing system of claim 11, wherein the processor in optimizing placement performs mixed integer processing.

14. The data processing system of claim 11, wherein well completions of a plurality of multilateral wells are formulated and wherein:

the processor in generating a model performs the step of generating a model for the plurality of multilateral wells by transshipment network analysis of the measures of expected cumulative production to maximize produced hydrocarbons for the cells;

the processor in optimizing placement performs the step optimizing placement of the generated model of the plurality of multilateral wells in the reservoir model; and wherein the user interface performs the step of forming an output display of the plurality of multilateral wells at locations in the reservoir model according to the optimized placement.

15. The data processing system of claim 11, wherein the hydrocarbon fluids comprise oil and gas.

16. The data processing system of claim 15, wherein the processor in performing a reservoir simulation further performs the step of determining water content of the cells in the reservoir model.

17. The data processing system of claim 16, wherein the processor in forming a measure of expected cumulative production performs the step of:

forming a measure of expected cumulative production for the cells based on productivity of the determined hydrocarbon fluid and water content of the cells.

18. The data processing system of claim 11, wherein the processor in optimizing placement performs the step of optimizing placement by local optimization of the generated model of the at least one multilateral well in the reservoir model.

19. The data processing system of claim 11, wherein the processor in optimizing placement performs the step of optimizing placement by global optimization of the generated model of the at least one multilateral well in the reservoir model.

20. The data processing system of claim 19, wherein the processor in optimizing placement by global optimization performs the steps of:
- partitioning the global optimization into plural subproblems having common properties;
- recursively solving the partitioned subproblems to form partitioned solutions; and
- combining the partitioned solutions.

21. A data storage device having stored in a non-transitory computer readable medium computer operable instructions for causing a data processing system to formulate well completions of at least one multilateral well in a subsurface reservoir producing hydrocarbon fluids, the reservoir being organized as a reservoir model partitioned into a number of cells, the instructions stored in the data storage device causing at least one processor in the data processing system to perform the following steps:
- performing a reservoir simulation to determine hydrocarbon fluid content of the cells in the reservoir model;
- forming a measure of expected cumulative production for the cells based on productivity of the determined hydrocarbon fluid content of the cells;
- generating a model for the at least one multilateral well by transshipment network analysis of the measures of expected cumulative production to maximize produced hydrocarbons for the cells;
- optimizing placement of the generated model of the at least one multilateral well in the reservoir model;
- forming an output display of the at least one multilateral well at a location in the reservoir model according to the optimized placement; and
- placing the at least one multilateral well in the subsurface reservoir according to the location in the reservoir model formed in the output display.

22. The data storage device of claim 21, wherein the instructions further comprise instructions causing the processor to perform the step of forming a measure of expected cumulative production by forming a matrix for the cells of the reservoir model.

23. The data storage device of claim 21, wherein the instructions for optimizing placement cause the processor to optimize placement by mixed integer processing.

24. The data storage device of claim 21, wherein well completions of a plurality of multilateral wells are formulated and wherein:
- the instructions for generating cause the processor to generate a model for the plurality of multilateral wells by transshipment network analysis of the measures of expected cumulative production to maximize produced hydrocarbons for the cells;
- the instructions for optimizing placement cause the processor to optimize placement of the generated model of the plurality of multilateral wells in the reservoir model; and
- the instructions for forming an output display cause the processor to form an output display of the plurality of multilateral wells at locations in the reservoir model according to the optimized placement.

25. The data storage device of claim 21, wherein the hydrocarbon fluids comprise oil and gas.

26. The data storage device of claim 25, wherein the instructions for performing a reservoir simulation further comprises instructions for determining water content of the cells in the reservoir model.

27. The data storage device of claim 26, wherein the instructions for forming a measure of expected cumulative production further comprise instructions to cause the processor to perform the step of
- forming a measure of expected cumulative production for the cells based on productivity of the determined hydrocarbon fluid and water content of the cells.

28. The data storage device of claim 21, wherein the instructions for optimizing placement comprise instructions to cause the processor to perform the step of optimizing placement by local optimization of the generated model of the at least one multilateral well in the reservoir model.

29. The data storage device of claim 21, wherein the instructions for optimizing placement comprise instructions to cause the processor to perform the step of optimizing placement by global optimization of the generated model of the at least one multilateral well in the reservoir model.

30. The data storage device of claim 29, wherein the instructions for optimizing placement by global optimization include instructions to cause the processor to perform the steps of:
- partitioning the global optimization into plural subproblems having common properties;
- recursively solving the partitioned subproblems to form partitioned solutions; and
- combining the partitioned solutions.

* * * * *